United States Patent [19]
Murashita

[11] Patent Number: 5,914,680
[45] Date of Patent: Jun. 22, 1999

[54] DATA ENCODING METHOD AND APPARATUS AND DATA DECODING METHOD AND APPARATUS

[75] Inventor: Kimitaka Murashita, Kawasaki, Japan

[73] Assignee: Fujitsu Limited, Kawasaki, Japan

[21] Appl. No.: 08/922,399

[22] Filed: Sep. 3, 1997

[30] Foreign Application Priority Data

Jan. 21, 1997 [JP] Japan ................................. 9-008895

[51] Int. Cl.⁶ .................................................. H03M 7/40
[52] U.S. Cl. ........................................... 341/107; 341/106
[58] Field of Search ............................... 341/107, 50, 52, 341/55, 65, 67, 106

[56] References Cited

U.S. PATENT DOCUMENTS

| | | |
|---|---|---|
| 4,376,933 | 3/1983 | Saran et al. . |
| 4,612,532 | 9/1986 | Bacon et al. ............................ 340/347 |
| 5,313,203 | 5/1994 | Suu ......................................... 341/106 |
| 5,404,166 | 4/1995 | Gillard et al. .......................... 348/390 |
| 5,436,626 | 7/1995 | Fujiwara et al. . |
| 5,537,551 | 7/1996 | Denenberg et al. ............... 395/200.18 |

FOREIGN PATENT DOCUMENTS

| | | |
|---|---|---|
| 0 280 549 | 8/1988 | European Pat. Off. . |
| 0 283 735 | 9/1988 | European Pat. Off. . |
| 0 617 518 | 9/1994 | European Pat. Off. . |
| 2 152 253 | 7/1985 | United Kingdom . |
| 86/00479 | 1/1986 | WIPO . |

*Primary Examiner*—Brian Young
*Attorney, Agent, or Firm*—Staas & Halsey

[57] ABSTRACT

A data encoding and decoding method and apparatus which performs a high-speed operation using the F-V encoding. Input data including a plurality of elementary data having a predetermined length is encoded by assigning a code to each elementary data. The code has a code length corresponding to a frequency of appearance of the corresponding elementary data so that the assigned code is packed into a data unit having a fixed data length. The code length of the code assigned to each elementary data is fixed to a predetermined length so that the data unit having the fixed data length is formable by a plurality of the predetermined lengths. Each elementary data is encoded into the code having the fixed code length. The code is packed so that the code is output when a total length of the packed codes becomes the fixed data length of the data unit.

20 Claims, 14 Drawing Sheets

FIG. 1 PRIOR ART
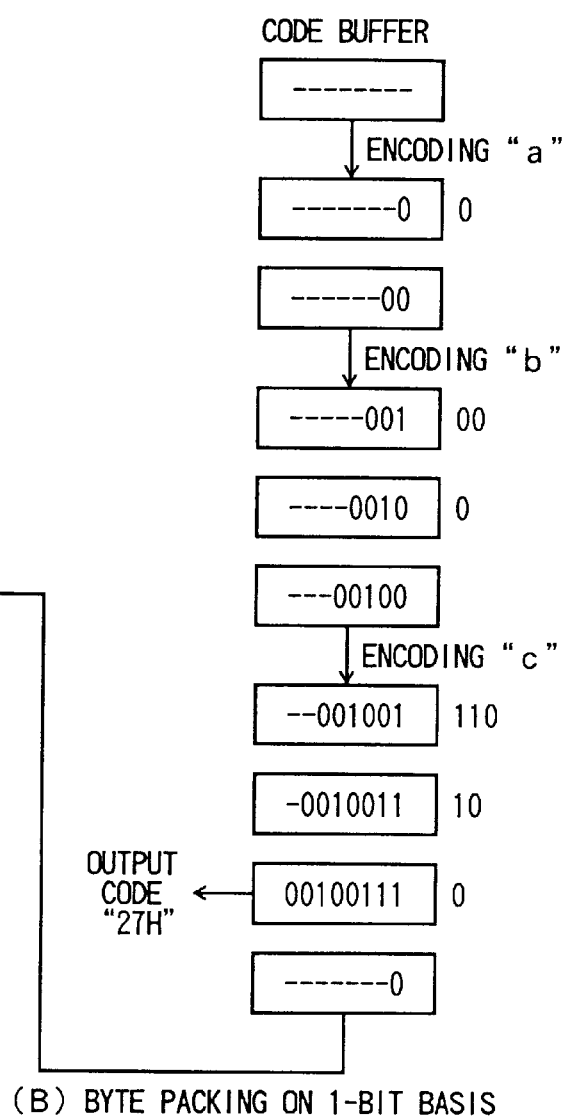
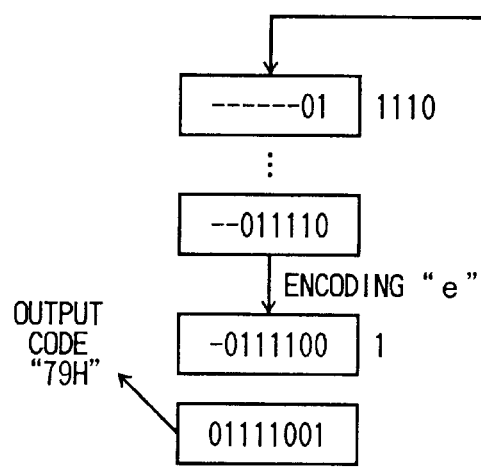
(A) CODE BASED ON FREQUENCY
(B) BYTE PACKING ON 1-BIT BASIS

FIG. 7

| SYMBOL | FREQUENCY | PROBABILITY | CODE LENGTH |
|---|---|---|---|
| "a" | 4 | $0.2$ $(1/2^3 < 0.2 < 1/2^2)$ | 3 BIT |
| "b" | 3 | $0.15$ $(1/2^3 < 0.15 < 1/2^2)$ | 3 BIT |
| "c" | 2 | $0.1$ $(1/2^4 < 0.1 < 1/2^3)$ | 4 BIT |
| "d" | 1 | $0.05$ $(1/2^5 < 0.05 < 1/2^4)$ | 5 BIT |
| "e" | 10 | $0.5$ $(1/2^1 < 0.5 < 1/2^0)$ | 1 BIT |

(A) OBTAIN CODE LENGTH FROM FREQUENCY

| SYMBOL | CODE LENGTH | CHANGE OF CODE LENGTH |
|---|---|---|
| "a" | 3 | → 2 BIT |
| "b" | 3 | → 2 BIT |
| "c" | 4 | → 4 BIT |
| "d" | 5 | → 4 BIT |
| "e" | 1 | → 2 BIT |

(B) CHANGE TO 2, 4 BITS

| SYMBOL | CODE LENGTH | CODE (BINARY) |
|---|---|---|
| "a" | 2 BIT | 01 |
| "b" | 2 BIT | 10 |
| "c" | 4 BIT | 1100 |
| "d" | 4 BIT | 1101 |
| "e" | 2 BIT | 00 |

(C) ASSIGN CODE

| SYMBOL | CODE(BINARY) | FREQUENCY |
|--------|--------------|-----------|
| "a"    | 00           | 0.35      |
| "b"    | 10           | 0.15      |
| "c"    | 1110         | 0.05      |
| "d"    | 111100       | 0.05      |
| "e"    | 01           | 0.4       |

(A) CODES ASSIGNED WITH 2,4,6-BIT-LENGTH CODES BASED ON FREQUENCY (B) BYTE PACKING ON 2-BIT UNIT BASIS

FIG. 16

| SYMBOL | CODE(BINARY) | FREQUENCY |
|---|---|---|
| "a" | 00 | 0.35 |
| "b" | 100 | 0.15 |
| "c" | 1110 | 0.05 |
| "d" | 11110 | 0.05 |
| "e" | 01 | 0.4 |

(B)

| | 8-BIT COMBINATION | SYMBOL | CODE(BINARY) [8-BIT FIXED] | |
|---|---|---|---|---|
| COMBINED ENCODING TABLE | 2+2+2+2[BIT] | aaaa<br>aaae<br>...<br>aeee<br>eeee | 00000000<br>00000001<br>...<br>00010101<br>01010101 | (16) |
| | 2+2+4[BIT] | aac<br>aca<br>...<br>ece<br>cee | 00001110<br>00111000<br>...<br>01111001<br>11100101 | (12) |
| | 2+3+3[BIT] | abb<br>bab<br>...<br>beb<br>bbe | 00100100<br>10000100<br>...<br>10001100<br>10010001 | (6) |
| | 4+4[BIT] | cc | 11101110 | (1) |
| | 3+5[BIT] | bd<br>db | 10011110<br>11110100 | (2) |
| SINGLE ENCODING TABLE | | a<br>b<br>c<br>d<br>e | 00xxxxxx<br>100xxxxx<br>1110xxxx<br>11110xxx<br>01xxxxxx | (5) |

42 TOTAL

[x: DON'T CARE]
SINGLE ENCODING TABLE IS USED WHEN NOT FOUND IN COMBINED ENCODING TABLE

DATA ENCODING METHOD AND APPARATUS AND DATA DECODING METHOD AND APPARATUS

BACKGROUND OF THE INVENTION

1. Field of the Invention

The present invention relates to a data encoding method and apparatus and a data decoding method and apparatus and, more particularly, to a data encoding method and apparatus which encode character data having a fixed length by assigning a code length corresponding to an output frequency, and a data decoding method and apparatus which decode such encoded data.

In recent years, various types of data such as a character code, vector information and image data are handled by computers. The amount of data to be handled has been rapidly increasing. When a large amount of data is processed, a necessary memory capacity can be reduced and a high-speed data transmission can be achieve by compressing the data by eliminating a redundant part of the data.

As a method for compressing data by eliminating a redundant part of the data, a universal encoding method has been suggested. The universal encoding method is classified into a F-V encoding and a V-F encoding according to the difference of their input and output methods.

The F-V encoding converts characters or character strings having a fixed length into one having a variable length. On the other hand, the V-F encoding converts characters or character strings having a variable length into one having a fixed length. Generally, the Huffman coding is classified into the F-V encoding, and a Lempel-Ziv coding is classified into the V-F encoding.

Since the F-V encoding converts an input character into a code having a predetermined length, the code can be quickly obtained from a code table but an output of the code is slow. In the V-F encoding, since a length of a character string to be encoded is not fixed and encoding is performed by searching for the corresponding longest character string, it takes a long time to obtain a code.

As mentioned above, in either case, there is a problem in that a long time is needed to output the code. Thus, the present invention aims to attempt a high-speed encoding by increasing an output speed of the code in the F-V encoding.

2. Description of the Related Art

FIG. 1 is an illustration for explaining an operation for outputting a code in a conventional F-V encoding. FIG. 1-(A) illustrates a relationship between symbols and codes; FIG. 1-(B) illustrates a byte packing operation.

In the conventional F-V encoding, as shown in FIG. 1-(A), a 2-bit code "00" is set to a symbol "a"; a code "100" is set to a symbol "b", a code "1110" is set to a symbol "c"; a code "11110" is set to a symbol "d"; and a code "01" is set to a symbol "e". Each code is set in accordance with a probability of appearance.

Conventionally, since the code is output when an 8-bit capacity of a code buffer is filled. For example, when the symbol "a" is encoded as shown in FIG. 1-(B), the code "00" corresponding to the symbol "a" is stored in the code buffer. Then, when the symbol "b" is encoded, the code "100" corresponding to the symbol "b" is stored in the code buffer subsequent to the code "00" corresponding to the symbol "a". Thus, a code "00100" is stored in the code buffer. When the symbol "c" is encoded, a code "111" included in the code "1110" corresponding to the symbol "c" is stored in the buffer. Thus, an 8-bit code "00100111" is stored in the code buffer, and the code is output from the code buffer. Reaming code "0" of the symbol "c" is stored in the code buffer. Then, when the symbol "d" is encoded, the code "11110" corresponding to the symbol "d" is stored in the code buffer subsequent to the remaining code "0" of the symbol "c". Thus, the code stored in the code buffer becomes "011110". Then, when the symbol "e" is input, the code "01" corresponding to the symbol "e" is supplied to the code buffer, and thus an 8-bit code "01111001" is stored in the code buffer, and the code is output from the code buffer.

As mentioned above, in the conventional method, a code is byte packed in the code buffer on a single-bit basis, and the code is output from the code buffer each time when 8 bits are stored in the code buffer.

Accordingly, in the conventional F-V encoding, there is a problem in that the output of the code is delayed since the code is byte packed in the code buffer on a single-bit basis, and the code is output from the code buffer each time when 8 bits are stored in the code buffer.

SUMMARY OF THE INVENTION

It is a general object of the present invention to provide an improved and useful data encoding and decoding method and apparatus in which the above-mentioned problems are eliminated.

A more specific object of the present invention is to provide a data encoding and decoding method and apparatus which achieves a high-speed operation using the F-V encoding.

In order to achieve the above-mentioned objects, there is provided according to one aspect of the present invention a data encoding method for encoding input data which includes a plurality of elementary data by assigning a code to each elementary data, said code having a code length corresponding to a frequency of appearance of the corresponding elementary data, the assigned code to be output being packed into a data unit having a fixed data length, said data encoding method comprising the steps of:

a) fixing the code length of the code assigned to each elementary data to a predetermined length so that said fixed data length of said data unit is a multiple of the predetermined length;

b) encoding each elementary data into the code having the predetermined length; and c) packing the encoded code into said data unit so that the encoded code is output when a total length of the packed codes becomes said fixed data length of said data unit.

FIG. 2 is a flowchart for explaining a principle of the above-mentioned invention. In FIG. 2, step S1-1 corresponds to step a), step S1-2 corresponds to step b) and step S1-3 corresponds to step c).

According to the above-mentioned invention, since the fixed data length of the data unit is set to a multiple of the length of the code assigned to the elementary data, the code assigned to the elementary data can be packed by the data unit. Accordingly, the output data corresponding to the data unit having the fixed code length is always filled with effective codes, and, thereby, a high-speed and efficient output of codes can be achieved.

In the data encoding method mentioned above, a packing of the encoded code is performed on a code unit basis so that the encoded code is prevented from being divided and packed into a plurality of said data units.

Additionally, in the data encoding method mentioned above, the predetermined length of the code assigned to each elementary data in step a) may include a plurality of lengths so that said fixed data length of said data unit is formable by a combination of said plurality of lengths.

According to the above-mentioned invention, since a plurality of codes having different code lengths are combined to form the output data in the data unit having the fixed data length, the codes to be output can be efficiently packed into the data unit having the fixed data length.

Additionally, the data encoding method mentioned above may further comprise the step of:

d) counting the frequency of appearance of each elementary data contained in the input data, wherein one of said lengths is assigned, in step a), to each elementary data in accordance with the frequency of appearance of the elementary data.

FIG. 3 is a flowchart for explaining a principle of the above-mentioned invention. In FIG. 3, step S2-1 corresponds to step d) of the above mentioned invention.

According to this invention, since one of the plurality of code having different code lengths is assigned to each elementary data, a code having a shorter code length can be assigned to the elementary data having a higher frequency of appearance. Thus, a length of the codes which are a result of encoding can be minimized, resulting in a high-speed output.

Additionally, there is provided according to another aspect of the present invention a data encoding apparatus for encoding input data which includes a plurality of elementary data having a fixed length by assigning a code to each elementary data, said code having a code length corresponding to a frequency of appearance of the corresponding elementary data, the assigned code to be output being packed into a data unit having a fixed data length, said data encoding apparatus comprising:

a frequency counting unit for counting the frequency of appearance of each elementary data in said input data;

an encoding table producing unit for producing an encoding table produced based on a plurality of predetermined code lengths in accordance with the frequency counted by said frequency counting unit;

an encoding unit for encoding the input data into a set of the codes in accordance with said encoding table produced by said encoding table producing unit;

a code outputting unit for packing the codes obtained by said encoding unit, and outputting the packed codes by said data unit having said fixed data length; and a code information outputting unit for outputting information with respect to said encoding table.

According to this invention, since one of the plurality of codes having different code lengths is assigned to each elementary data, a code having a shorter code length can be assigned to the elementary data having a higher frequency of appearance. Thus, a length of the codes which are a result of encoding can be minimized, resulting in a high-speed output. Additionally, the fixed data length of the data unit is a multiple of the length of the code assigned to the elementary data so that the code can be packed and output by the data unit having the fixed data length. Accordingly, the output data corresponding to the data unit having the fixed data length is always filled with effective codes, and, thereby, a high-speed and efficient output of codes can be achieved.

Additionally, there is provided according to another aspect of the present invention a data encoding apparatus for encoding input data which includes a plurality of elementary data having a fixed length by assigning a code to each elementary data, the code having a code length corresponding to a frequency of appearance of the corresponding elementary data, the assigned code to be output being packed into a data unit having a fixed data length, said data encoding apparatus comprising:

an encoding table storing unit for storing an encoding table in which one of a plurality of codes having different code lengths is assigned to each elementary data;

an encoding unit for encoding said elementary data in accordance with said encoding table; and a code outputting unit for outputting the codes obtained by said encoding unit by packing the codes into said data unit having said fixed data length.

According to this invention, since the encoding table is previously produced and stored in the data encoding apparatus, an encoding operation can be performed without producing the encoding table after the input data to be decoded is supplied. Additionally, since a decoding table can be previously produced in accordance with the previously produced encoding table, there is no need to send information with respect to the encoding table from the data encoding apparatus to a data decoding apparatus. This reduces an amount of information to be transmitted from the data encoding apparatus to the data decoding apparatus.

Additionally, there is provided according to another aspect of the present invention a data encoding apparatus for encoding input data which includes a plurality of elementary data having a fixed length by assigning a code to each elementary data, the code having a code length corresponding to a frequency of appearance of the corresponding elementary data, the assigned code to be output being packed into a data unit having a fixed data length, the input data being divided into block data having a predetermined amount of data, said data encoding apparatus comprising:

a frequency counting unit for counting a frequency of each elementary data in each block data;

an encoding table producing unit for producing an encoding table which represents a relationship between the elementary data and predetermined code lengths corresponding to the frequency obtained by said frequency counting unit;

an encoding unit for encoding the block data in accordance with said encoding table produced by said encoding table producing unit; and a code outputting unit for outputting the codes obtained by said encoding unit by packing the codes into said data unit having said fixed data length.

According to this invention, the input data is divided into block data, and the encoding operation is performed on each block data by using the encoding table produced based on the frequency of appearance of the elementary data in the previous block data. Thus, an efficient encoding can be performed with a shorter code length, resulting in a high-speed output.

Additionally, there is provided according to another aspect of the present invention a data encoding apparatus for encoding input data which includes a plurality of elementary data having a fixed length by assigning a code to said data, said code having a code length corresponding to a frequency of appearance of the corresponding elementary data, the assigned data to be output being packed into a data unit having a fixed data length so, the input data being divided into block data having a predetermined amount of data, said data encoding apparatus comprising:

a frequency counting unit for counting a frequency of each elementary data in each block data;

an encoding table storing unit for storing an initial encoding table in which one of a plurality of codes having different code lengths is assigned to each elementary data;

a first encoding unit for encoding the block data in accordance with said previously produced encoding table, first block data which is first divided from the input data is encoded by said first encoding unit;

an encoding table producing unit for producing an encoding table which represents a relationship between the elementary data and the codes having predetermined code lengths corresponding to the frequency obtained by said frequency counting unit;

a second encoding unit for encoding second block data subsequent to said first block data and the block data subsequent to the second block data in accordance with said encoding table produced by said encoding table producing unit, an encoding operation of said second encoding unit being performed based on said encoding table which is produced in accordance with the frequency of appearance of the elementary data included in the block data previous to the block data presently encoded;

a code outputting unit for outputting the codes obtained by one of said first and second encoding units by packing the codes into said data unit having said fixed data length; and a control unit for controlling an encoding operation of said data encoding apparatus.

According to this invention, since the encoding table is previously produced for the first block data, the encoding operation for the first block data is started immediately after the first block data is supplied. Thus, there is no time delay due to preparation of the encoding table for the first block data, resulting a high-speed output.

Additionally, there is provided according to another aspect of the present invention a data encoding apparatus for encoding input data which includes a plurality of elementary data having a fixed length by assigning a code to each elementary data, the code having a code length corresponding to a frequency of appearance of the corresponding elementary data, the assigned code to be output being packed into a data unit having a fixed data length, the input data being divided into block data having a predetermined amount of data, said data encoding apparatus comprising:

a frequency counting unit for counting a frequency of appearance of each elementary data in the block data;

a data buffer for storing first block data which is divided first from the input data;

an encoding table producing unit for producing an encoding table which represents a relationship between the elementary data and the codes having predetermined code lengths corresponding to the frequency obtained by said frequency counting unit;

a first encoding unit for encoding said first block data in accordance with said encoding table produced by said encoding table producing unit, an encoding operation of said first encoding unit being performed based on said encoding table which is produced in accordance with the frequency of appearance of the elementary data included in said first block data;

a second encoding unit for encoding second block data and the block data subsequent to said second block data in accordance with said encoding table produced by said encoding table producing unit, an encoding operation of said second encoding unit being performed based on said encoding table which is produced in accordance with the frequency of appearance of the elementary data included in the block data previous to the block data presently encoded;

a code outputting unit for outputting the codes obtained by one of said first and second encoding units by packing the codes into said data unit having said fixed data length; and a control unit for controlling an encoding operation of said data encoding apparatus so that said first block data is supplied to said first encoding unit via said data buffer, and said second and subsequent block data is supplied to said second encoding unit.

According to this invention, since the first block data is encoded by using the encoding table based on the frequency obtained from the first block data and the second and subsequent block data is encoded by using the encoding table based on the frequency obtained from the previous block data, the first block data can be efficiently encoded. Thus, the amount of output code is reduced, resulting in a high-speed output.

Additionally, there is provided according to another aspect of the present invention a data encoding apparatus for encoding input data which includes a plurality of data having a fixed length by assigning a code to each elementary data, said code having a code length corresponding to a frequency of appearance of the corresponding elementary data, the assigned code to be output being packed into a data unit having a fixed data length, the input data being divided into block data having a predetermined amount of data, said data encoding apparatus comprising:

a frequency counting unit for counting a frequency of each elementary data included in the block data;

an encoding table producing unit for producing an encoding table which represents a relationship between the elementary data and the codes having predetermined code lengths corresponding to the frequency obtained by said frequency counting unit;

an encoding unit for encoding the block data in accordance with said encoding table produced by said encoding table producing unit, an encoding operation of said encoding unit being performed based on said encoding table which is produced in accordance with the frequency of appearance of the elementary data included in the block data previous to the block data presently encoded;

a code outputting unit for outputting the code obtained by said encoding unit by packing the codes into said unit having said fixed data length; and a control unit for controlling an encoding operation of said data encoding apparatus so that first block data which is first divided from said input data is directly output, and second and subsequent block data is supplied to said encoding unit.

According to this invention, since the first block data is directly output without encoding, and the second and subsequent block data is encoded by using the encoding table based on the frequency obtained from the previous block data, the supplied block data can be immediately output, resulting in a high-speed output.

In the data encoding apparatus according to the above-mentioned invention, the frequency counting unit may count the frequency of appearance of the elementary data within a predetermined part of the block data. Thus, a time period for producing the encoding table is reduced as compared to a time period for producing the encoding table based on the entire block data.

Additionally, the first and second encoding units may provide a predetermined code at an end of a series of the codes corresponding to each block data. According to this invention, the predetermined code may be detected in a data decoding apparatus so as to distinguish each block data. Thus, an operation for distinguishing each block data in the data decoding apparatus can be simplified.

Additionally, there is provided according to another aspect to the present invention a data decoding apparatus for decoding a code to original data, said code obtained by encoding said original data by assigning said code corresponding to a frequency of appearance of data having a fixed data length, said data decoding apparatus comprising:

a decoding table storing unit for storing a first decoding table which corresponds to an encoding table used for encoding said original data;

a first decoding unit for decoding a first sets of the codes in accordance with said first decoding table;

a frequency counting unit for counting a frequency of appearance of the original data decoded from said code;

a decoding table producing unit for producing a second decoding table representing a relationship between the original data and the code having a predetermined code length in accordance with the frequency obtained by said frequency counting unit;

a second decoding unit for decoding a second set and subsequent sets of the codes in accordance with said second decoding table corresponding to a set of the codes previous to a set of codes presently decoded; and a control unit for controlling supply of the codes so that said first set of the codes is supplied to said first decoding unit and said second set of the codes and said set of the codes subsequent to said second set of the codes are supplied to said second decoding unit.

According to this invention, since the first set of the codes is decoded by using the previously produced decoding table, and the second and subsequent sets of codes are decoded by using the decoding table based on the frequency obtained from the previous set of codes, there is no need to supply the information with respect to the encoding table code information, resulting in reduction of amount of data to be transmitted from the data encoding apparatus to the data decoding apparatus.

Additionally, there is provided according to another aspect of the present invention a data encoding method for encoding input data which includes a plurality of elementary data having a fixed length by assigning a code to each elementary data, the code having a code length corresponding to a frequency of appearance of the corresponding elementary data, the assigned code to be output being packed into a data unit having a fixed data length, said data encoding method comprising the steps of:

a) counting a frequency of appearance of the elementary data in the input data;

b) assigning the code to each elementary data in accordance with the frequency counted in step a);

c) combining a plurality of elementary data so that a total length of the codes corresponding to the combined elementary data becomes said data unit having said fixed data length;

d) encoding the combined elementary data to a code, and outputting the code by said data unit having said fixed data length; and e) outputting code information used for decoding the code encoded in step d).

FIG. 4 is a flowchart for explaining a principle of the above-mentioned invention. In FIG. 4, step S3-1 corresponds to step a) of the above-mentioned data encoding method; step S3-2 corresponds to step b); step S3-3 corresponds to step c); step S3-4 corresponds to step d); and step S3-5 corresponds to step e).

According to this invention, since the plurality of elementary data is encoded simultaneously to the code in the unit of the predetermined data length, the encoding operation is efficiently performed, resulting in a high-speed output.

Additionally, there is provided according to another aspect of the present invention a data decoding method for decoding a code to original data, said code obtained by encoding said original data by assigning said code corresponding to a frequency of appearance of data having a fixed data length, said data decoding method comprising the steps of:

a) producing a decoding table in accordance with code information with respect to an encoding operation for producing said code;

b) decoding said code in accordance with said decoding table produced in step a) by each predetermined code length; and c) outputting a decoded value obtained in step b). FIG. 5 is a flowchart for explaining a principle of the above-mentioned invention. In FIG. 5, step S4-1 corresponds to step a) of the above-mentioned data decoding method; step S4-2 corresponds to step b); and step S4-3 corresponding to step c).

According to this invention, the code corresponding to a plurality of elementary data can be simultaneously decoded by using the decoding table which is produced based on the code information with respect to the encoding table for producing the code. Thus, the decoding operation is efficiently performed.

Additionally, there is provided according to another aspect of the present invention a data encoding apparatus for encoding input data including a plurality of elementary data having a fixed length by assigning a code to each elementary data, the code having a code length corresponding to a frequency of appearance of the corresponding elementary data, the assigned code to be packed being output by a data unit having a fixed data length, said data encoding apparatus comprising:

a frequency counting unit for counting a frequency of each data in the input data;

an encoding table producing unit for producing an encoding table which represents a relationship between the elementary data and the codes having predetermined code lengths corresponding to the frequency obtained by said frequency counting unit, said predetermined code length including a plurality of code lengths corresponding to each elementary data;

an encoding unit for encoding the input data in accordance with said encoding table produced by said encoding table producing unit;

a code outputting unit for outputting the codes encoded by said encoding unit by packing the code into said data unit having said fixed data length; and a code information outputting unit for outputting information with respect to said encoding table.

According to this invention, since a plurality of elementary data can be simultaneously encoded to the code in the unit of the predetermined data length, the encoding operation is efficiently performed, resulting in a high-speed output.

Other objects, features and advantages of the present invention will become more apparent from the following detailed description when read in conjunction with the accompanying drawings.

BRIEF DESCRIPTION OF THE DRAWINGS

FIG. 1 is an illustration for explaining an operation of a conventional encoding apparatus;

FIG. 7 is an illustration for explaining an operation of the first embodiment;

FIG. 16 is an illustration for explaining an operation of a code assigning unit according to the seventh embodiment of the present invention.

DETAILED DESCRIPTION OF THE PREFERRED EMBODIMENTS

Figure 2:
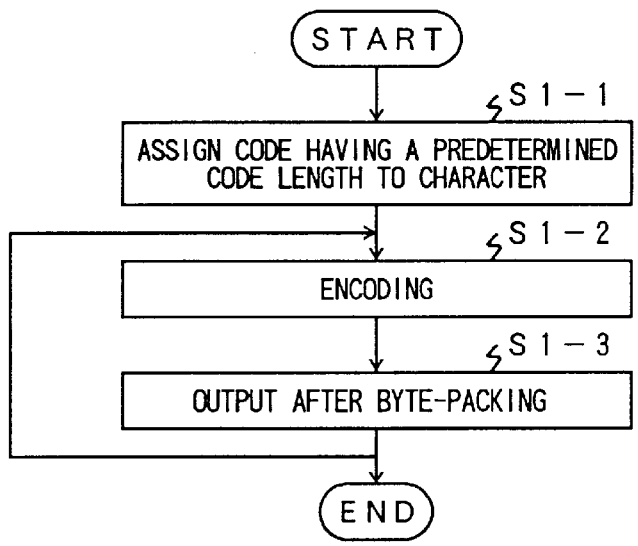
FIG. 2 is a flowchart for explaining a principle of the present invention.
Figure 3:
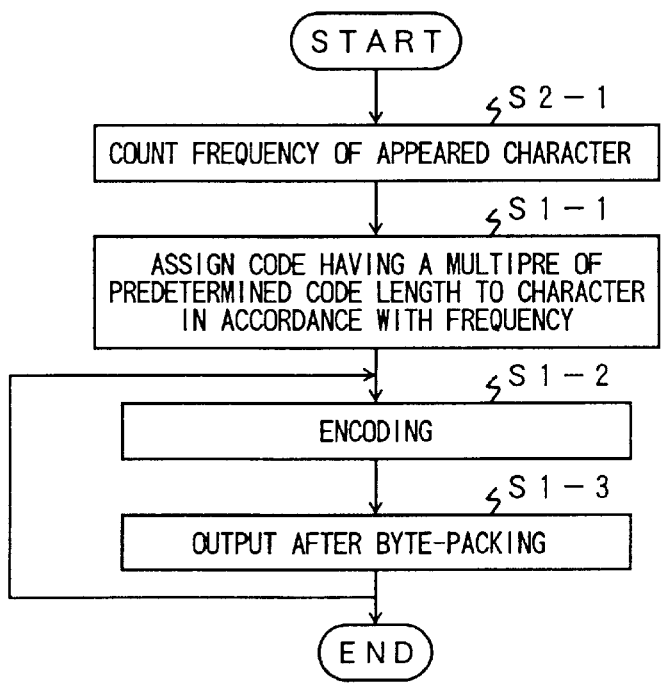
FIG. 3 is a flowchart for explaining a principle of the present invention.
Figure 4:
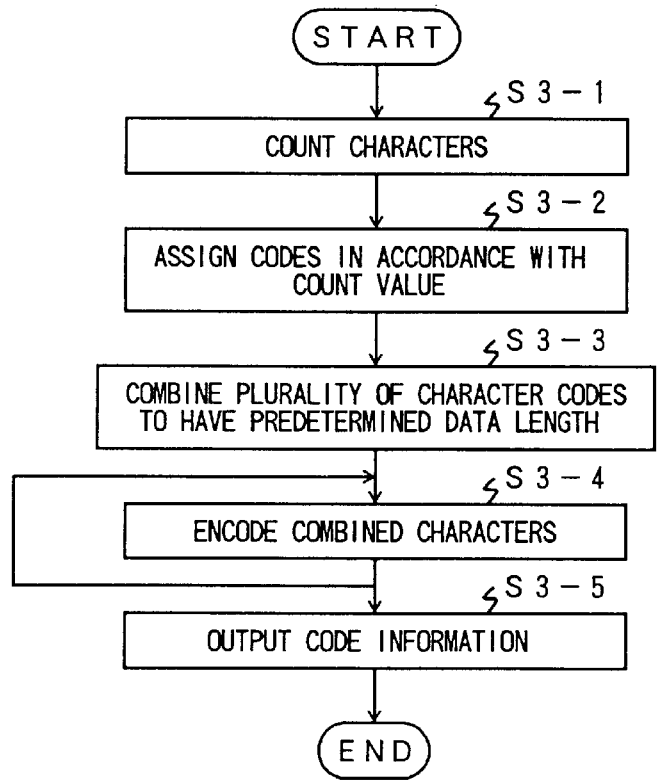
FIG. 4 is a flowchart for explaining a principle of the present invention.
Figure 5:
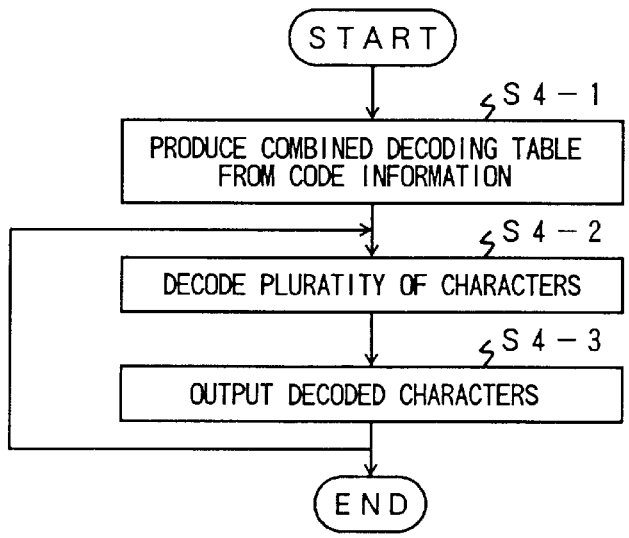
FIG. 5 is a flowchart for explaining a principle of the present invention.
Figure 6:
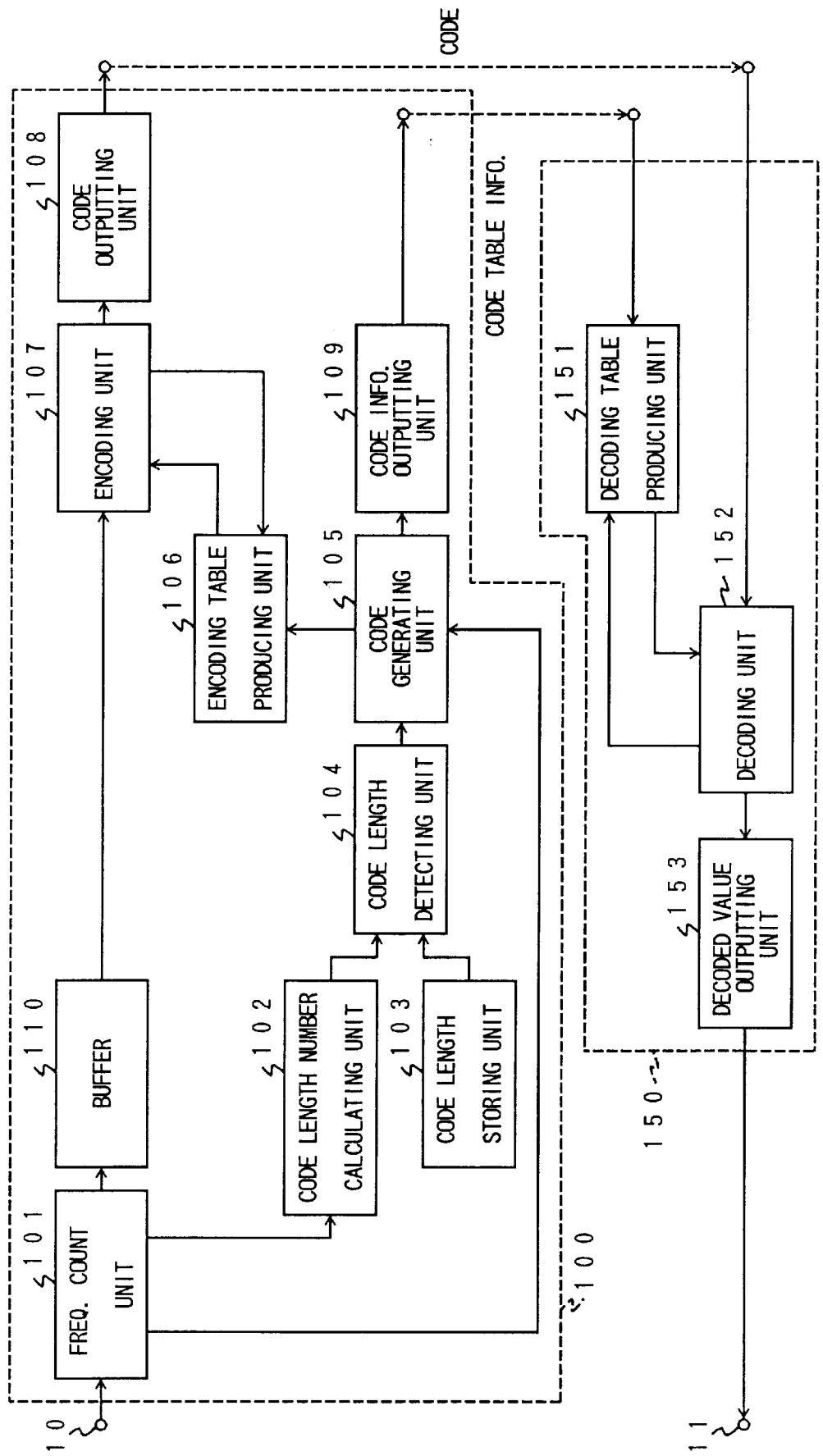
FIG. 6 is a block diagram of a first embodiment of the present invention.

A description will now be given of a first embodiment according to the present invention. FIG. 6 is a block diagram of an encoding apparatus 100 and a decoding apparatus 150 according to the first embodiment of the present invention.

A description will now be given of the encoding apparatus 100. In FIG. 6, data is input to the encoding apparatus 100 via an input terminal 10, and then the input data is supplied to a frequency counting unit 101. The frequency counting unit 101 calculates a frequency of appearance of a character in the input data. The target of calculation may be a part of the character or the entire character.

After being subjected to the calculation of frequency by the frequency counting unit 101, the input data is stored in a buffer 110. On the other hand, the frequency information obtained from the input data by the frequency counting unit 101 is supplied to a code length number calculating unit 102.

The code length number calculating unit 102 calculates the number of codes lengths corresponding to the number of frequencies indicated by the frequency information obtained by the frequency counting unit 101. The number of code lengths calculated by the code length number calculating unit 102 is supplied to the code length detecting unit 104.

The code length detecting unit 104 classifies the number of code lengths into code lengths previously stored in a code length storing unit 103. A code generating unit 105 assigns the codes having the code length assigned by the code length detecting unit 104 to the codes corresponding to the frequencies obtained by the frequency counting unit 101 in an ascending order from a shorter code. The results are supplied to an encoding table producing unit 106. The encoding table producing unit 106 produces an encoding table based on the codes obtained from the code generating unit 105.

Additionally, the code generating unit 105 supplies to a code information outputting unit 109 code information which is necessary for encoding. The code information outputting unit 109 collectively outputs the code information to the decoding apparatus 150. The code information output from the code information outputting unit 109 includes the information regarding the number of classified codes and the frequency.

On the other hand, the input data stored in the buffer 110 is supplied to an encoding unit 107 so as to be subjected to an encoding. The encoding unit 107 encodes the input data stored in the buffer 110 in accordance with the code table produced by the encoding table producing unit 106. At this time, if the data being subjected to frequency counting by the frequency counting unit 101 is set as predetermined data in the input data, the predetermined data subjected to frequency counting is detected by the frequency counting unit 101. Thereafter, the data which is not subjected to frequency counting is supplied via the buffer 110 to the encoding unit 107 so as to be subjected to encoding.

The code encoded by the encoding unit 107 is supplied to a code outputting unit 108. The code outputting unit 108 outputs the code, which is represented by bits, by packing the bits into a byte comprising a predetermined number of bits. In the byte packing performed by the code outputting unit 108, the code is output by being packed on a 2-bit unit basis if the code lengths of the code length storing unit 103 are multiples of 2, and on a 4-bit unit basis if the code lengths are multiples of 4. This process is performed on the entire input data to encode the input data.

Figure 8:
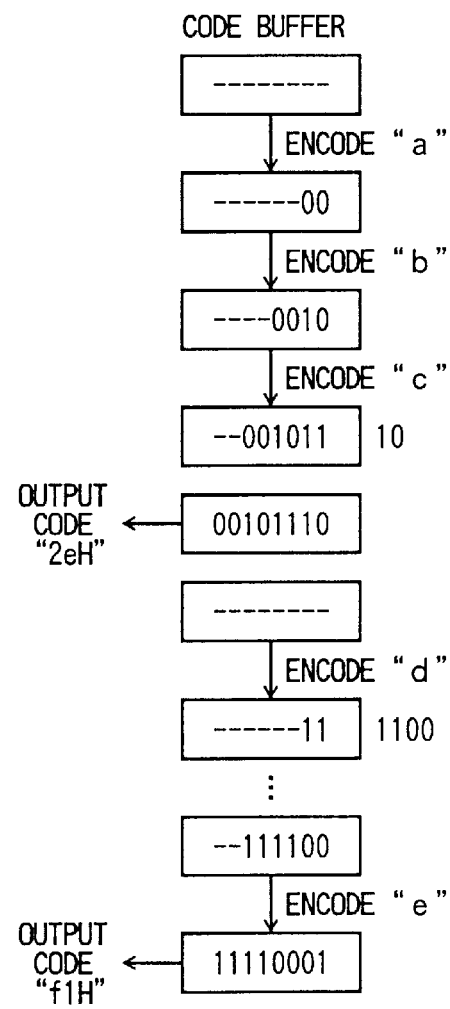
FIG. 8 is an illustration for explaining an operation of the first embodiment when outputting a code.

FIGS. 7 and 8 are illustrations for explaining an encoding operation of the first embodiment according to the present invention. FIG. 7-(A) explains an operation for obtaining a code length from the output frequency from the code length detecting unit 104; FIG. 7-(B) and (C) explain an encoding operation of the encoding unit 107. FIG. 8 is an illustration for explaining a byte packing operation.

For example, it is assumed, as shown in FIG. 7-(A), that the frequency of appearance of a symbol "a" is 4 times; the frequency of appearance of a symbol "b" is 3 times; the frequency of appearance of a symbol "c" is 2 times; the frequency of appearance of a symbol "d" is 1 time; and the frequency of appearance of a symbol "e" is 10 times. Then, the probability of appearance of the symbol "a" is ($4/20$)= ($1/5$)=0.2; the probability of appearance of the symbol "b" is ($3/20$)=0.15; the probability of appearance of the symbol "c" is ($2/20$)=($1/10$)=0.1; the probability of appearance of the symbol "d" is ($1/20$)=0.05; and the probability of appearance of the symbol "e" is ($10/20$)=($1/2$)=0.5.

The probability of the symbol "a" satisfies a relationship $(1/2^3) < 0.2 < (1/2^2)$; the probability of the symbol "b" satisfies a relationship $(1/2^3) < 0.15 < (1/2^4)$; the probability of the symbol "c" satisfies a relationship $(1/2^4) < 0.1 < (1/2^3)$; the probability of the symbol "d" satisfies a relationship $(1/2^5) < 0.05 < (1/2^4)$; and the probability of the symbol "e" satisfies a relationship $(1/2^1) \leq 0.5 < (1/2^0)$.

Accordingly, the symbol "d" is normally represented by a code length of 5 bits; the symbol "c" is normally represented by a code length of 4 bits; the symbols "a" and "b" are normally represented by a code length of 3 bits; and the symbol "e" is normally represented by a code length of 1 bit. However, in the present embodiment, the code lengths to be applied are represented by code lengths, such as, for example, 2 bits or 4 bits, stored in the code length storing unit 103.

If the code lengths corresponding to the above-mentioned symbols "a", "b" "c", "d" and "e" are appropriately set so that the 2-bit code length and the 4-bit code length appear equally, 2 bits are provided to the symbol "a"; 2 bits are provided to the symbol "b"; 4 bits are provided to the symbol "c"; 4 bits are provided to the symbol "d"; and 2 bits are provided to the symbol "e", as shown in FIG. 7-(B).

In the code generating unit 105, the symbols are provided with codes in accordance with the code lengths provided by the code length detecting unit 104. For example, the codes are set in the order from higher probability of appearance as shown in FIG. 7-(C).

According to the above-mentioned operation, an encoding table indicating the codes corresponding to the symbols "a", "b", "c", "d" and "e" is set in the encoding table producing unit 106 as shown in FIG. 7-(C).

In the encoding unit 107, when the symbol "a" is supplied from the buffer 110, the symbol "a" is encoded into "01" by referring to the encoding table as shown in FIG. 7-(C); when the symbol "b" is supplied, the symbol "b" is encoded into the code "10"; when the symbol "c" is supplied, the symbol "c" is encoded into the code "1100"; when the symbol "d" is supplied, the symbol "d" is encoded into the code "1101"; and when the symbol "e" is supplied, the symbol "e" is encoded into the code "00".

The codes are supplied to the code outputting unit 108 so as to be output after byte packing. In the code outputting unit 108, codes to which 2, 4 or 6 bits are assigned in accordance with the frequencies is stored as shown in FIG. 8-(A).

When the symbol "a" is supplied from the buffer 110, the symbol "a" is encoded into a code "00" by the encoding unit 107 in accordance with the encoding table shown in FIG. 8-(A). The code "00" is stored in a code buffer provided in the code outputting unit 108.

When the symbol "b" is supplied, the symbol "b" is encoded into a code "10" in accordance with the encoding table shown in FIG. 8-(A). At this time, since the code outputting unit 108 collectively outputs 8 bits, the code "10" of the symbol "b" is stored in the code buffer together with the code "00"of the symbol "a". Accordingly, the code "0010" is stored in the code buffer.

Thereafter, when the symbol "c" is supplied, the symbol "c" is encoded into a code "1110" in accordance with the encoding table shown in FIG. 8-(A). The code is supplied to the code buffer. Thereby, the code stored in the code buffer becomes "00101110", and 8 bits are collected as shown in the middle of FIG. 8-(B). Since the code in the code buffer is 8 bits, the code outputting unit 108 simultaneously outputs the code "00101110" ("2eH": hexadecimal number).

Thereafter, when the symbol "d" is supplied, a code "111100" is stored in the code buffer. Thereafter, when the symbol "e" is supplied, an 8-bit code "11110001", which is a sum of the code "111100" of the symbol "d" and a code "01" of the code "e", is stored in the code buffer. At his time, the content of the code buffer becomes 8 bits, the code outputting unit 108 simultaneously outputs the code "11110001" ("f1H": hexadecimal number).

It should be noted that if a 4-bit code or 6-bit code is supplied after a 6-bit code is stored in the code buffer, the code presently stored in the code buffer is output first, and then the next code is stored in the code buffer.

As mentioned above, since the symbols are encoded into 2, 4 or 6-bit codes which are previously set in accordance with frequencies of appearance, and the output of the codes is performed for each 8 bits, a plurality of codes can be collectively output. Thus, the operation of the code outputting unit 108 can be reduced, resulting in a high-speed code output.

If the number of kinds of the code lengths is limited to N and if (N−2) code lengths are collected in accordance with the distribution of the code length corresponding to the frequency of appearance, the number of remaining code lengths can be obtained by calculation. Thus, an appropriate number can be assigned to the number N of the code lengths by collecting the (N−2) code lengths, resulting in a reduction of the assigning operations of the code lengths.

For example, the code lengths are classified into 3 types such as 4 bits, 8 bits and 12 bits which are multiples of 4. Additionally, it is assumed that 256 kinds of characters, which are from 0x00 to 0xff, are given when a character of a single byte is encoded. If the code length is represented by a probability, the probability of a 4-bit length code is represented by $(\frac{1}{2}^4)$; the probability of an 8-bit length code is represented by $(\frac{1}{2}^8)$; and the probability of a 12-bit length code is represented by $(\frac{1}{12}^{12})$. If the number of 4-bit length codes is n4; the number of 8-bit length codes is n8; and the number of 12-bit length codes is n12, the codes can be efficiently assigned without waste when the following equation is established.

$$\sum_{k=4,8,12} \left( nk \times \frac{1}{2^k} \right) = 1 \quad (1)$$

However, in practice, since the number of codes and the probability of appearance do not take optimum values, the assignment of codes is more efficient as the left side of the above-mentioned equation (1) is closer to "1".

$$n4+n8+n12=256 \quad (2)$$

Additionally, the following equation is obtained from the equation (1).

$$\frac{1}{2^4}n4 + \frac{1}{2^8}n8 + \frac{1}{2^{12}}n12 = 1 \quad (3)$$

The equation (3) is represented as follows.

$$256n4+16n8+n12=4096 \quad (4)$$

Accordingly, the number n8 of the 8-bit length codes is (256−17×n4), and the number n12 of the 12-bit length codes is (16×n4), where n4 is the number of 4-bit length code. The number 4 becomes n4≦15 since the equation (2) is (265−17×n4)>0. As mentioned above, when the codes are assigned to 4, 8 and 12 bit code lengths, the optimum number of 8-bit and 12-bit length codes can be obtained by calculation if the umber of 4-bit length codes is known. similarly, a remaining number of codes can be obtained by calculation based on the number of 8-bit or 12-bit length codes.

A description will now be given of the decoding apparatus 150.

The code information output from the code information outputting unit 109 is supplied to a decoding table producing unit 151. The decoding table producing unit 151 produce a decoding table which is used for decoding in accordance with the code information supplied by the code information outputting unit 109 of the encoding apparatus 150.

Additionally, the code output from the code outputting unit 108 of the encoding apparatus 100 is suppled to a decoding unit 152. The decoding unit 152 decodes the code from the code outputting unit 108 in accordance with the decoding table produced by the decoding table producing unit 151, and supplies it to a decoded value outputting unit 153. The decoded value outputting unit 153 outputs the code encoded by the encoding unit 152 to an output terminal 11.

It should be noted that when the above-mentioned encoding and decoding apparatuses are incorporated into a specific apparatus, there is a case that the tendency of data to be encoded is previously known. In such a case, substantially the same encoding table is produced every time if the encoding table is produced by counting the frequency for each data to be encoded. Accordingly, the encoding table may be produced previously so that encoding and decoding is performed every time in accordance with the previously produced encoding table.

Figure 9:
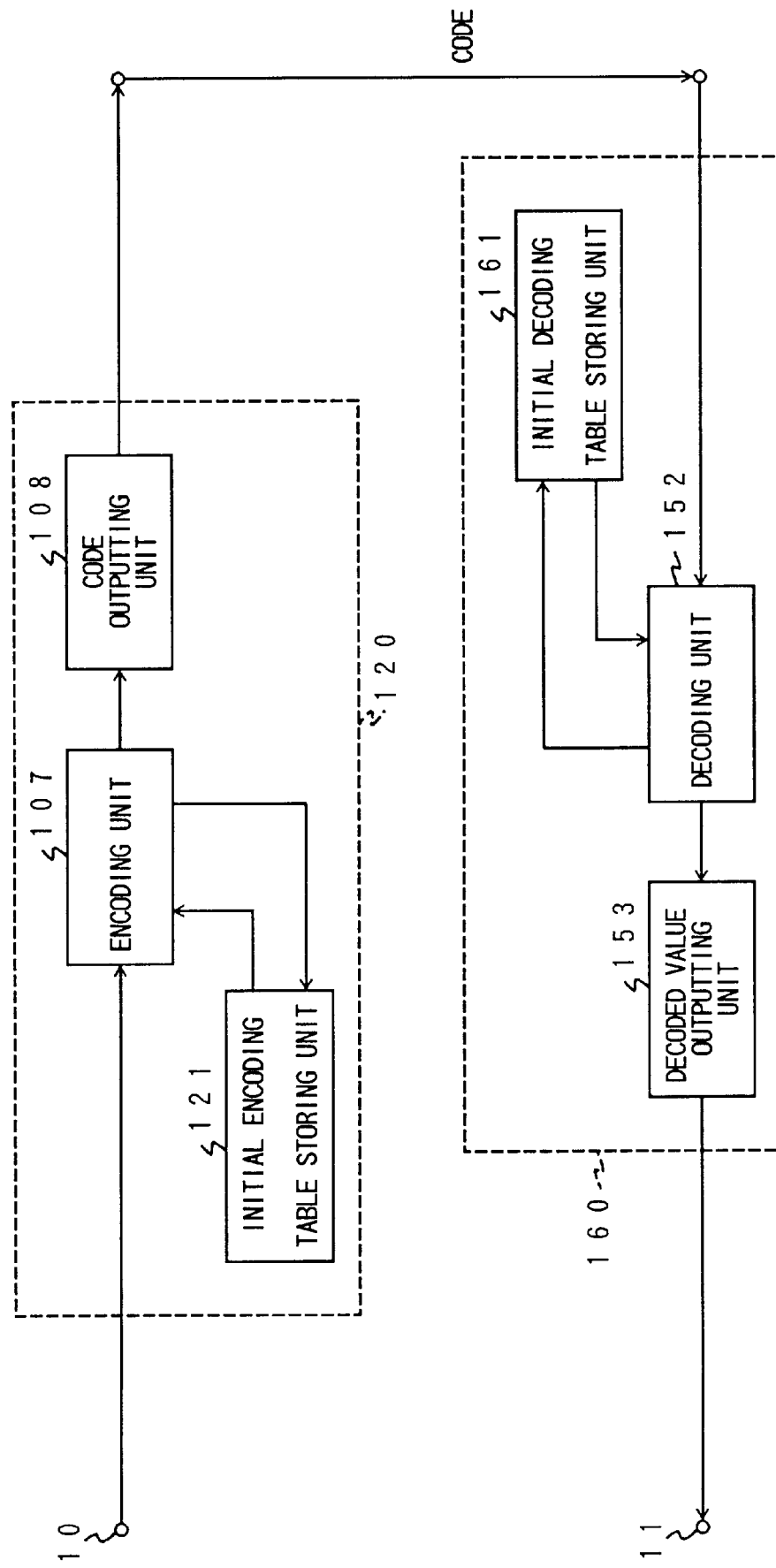
FIG. 9 is a block diagram of a second embodiment of the present invention.

FIG. 9 is a block diagram of a second embodiment according to the present invention. In FIG. 9, parts that are the same as the parts shown in FIG. 6 are given the same reference numerals, and descriptions thereof will be omitted.

The structure of the present embodiment differs from that of the first embodiment in that an encoding apparatus 120 and a decoding apparatus 160 are provided instead of the encoding apparatus 100 and the decoding apparatus 150 of the first embodiment, respectively.

In the encoding apparatus 120, an encoding table which corresponds to the tendency of data to be encoded is previously stored in an initial encoding table storing unit 121 so that the encoding unit 107 encodes the input data in accordance with the encoding table stored in the initial encoding table storing unit 121. It should be noted that the encoding table stored in the initial encoding table storing unit 121 includes only codes having predetermined code lengths similar to the encoding table produced by the encoding table producing unit 106.

Additionally, the decoding apparatus 160 is provided with an initial decoding table storing unit 161 instead of the decoding table producing unit 151. The initial decoding table storing unit 161 stores a decoding table corresponding to the encoding table stored in the initial encoding table storing unit 121. The decoding unit 152 decodes the code supplied from the code outputting unit 108 of the encoding apparatus 120 in accordance with the decoding table stored in the initial decoding table storing unit 161.

According to the present embodiment, there is no need to supply the code information from the encoding apparatus to the decoding apparatus as in the first embodiment. Thus, the amount of data transmitted from the encoding apparatus to the decoding apparatus can be reduced.

It should be noted that the encoding apparatus of the first and second embodiments produces an encoding table with respect to all input data. However, the input data may be divided into a plurality of block data so that the encoding data is produced for each block data.

Figure 10:
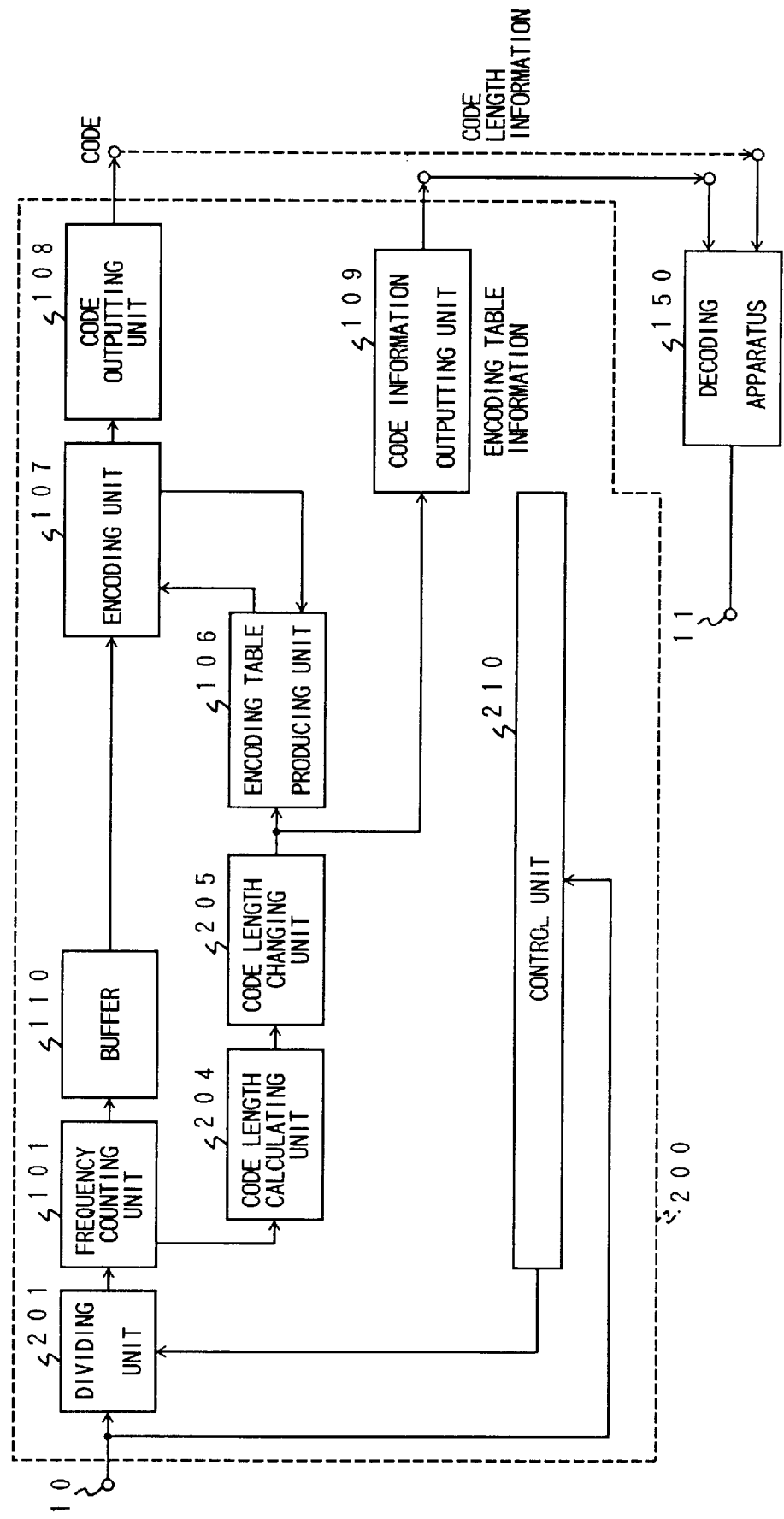
FIG. 10 is a block diagram of a third embodiment of the present invention.

FIG. 10 is a block diagram of a third embodiment of the present invention. In FIG. 10, parts that are the same as the parts shown in FIG. 6 are given the same reference numerals, and descriptions thereof will be omitted.

The present embodiment differs from the first embodiment in that an encoding apparatus 200 is different from the encoding apparatus 100 of the first embodiment.

The input data supplied to the encoding apparatus 200 is supplied to a dividing unit 201 and a control unit 210. The control unit 210 detects the amount of the input data, and divides the input data by a predetermined size by controlling the data dividing unit 201 which divides the data. Hereinafter, the divided data is referred to as block data.

The block data divided by the dividing unit 201 is supplied to the frequency counting unit 101 by each block data. The frequency counting unit 101 calculates the frequency of characters included in the block data, and supplies the frequency information to a code length calculating unit 204. On the other hand, the block data subjected to the calculation of the frequency counting unit 101 is supplied to the buffer 110.

In the code length calculating unit 204, a code length corresponding to the frequency is calculated. The code length calculated by the code length calculating unit 204 is supplied to a code length changing unit 205. The code length changing unit 205 assigns the calculated code length to a predetermined code length.

The encoding table producing unit 106 produces an encoding table which includes only the code lengths assigned by the code length changing unit 205. Additionally, the code information outputting unit 109 sends information with respect to the number of code lengths and the frequency to the encoding apparatus 150.

The encoding unit 107 receives the input data from the buffer 110 so as to encode the input data in accordance with the encoding table produced by the encoding table producing unit 106. The code encoded by the encoding unit 107 is supplied to the code outputting unit 108. The code outputting unit 108 packs the code into byte data, and outputs the packed data to the decoding apparatus 150. At this time, the packing of the codes is performed on a plurality-of-bits unit basis which corresponds to the predetermined code length as in the first embodiment.

It should be noted that, in the code outputting unit 108, there may be a case in which a special code such as an EOF (end of file) code is provided at the end of the code of single block data. In the decoding side, the end of the block data can be detected by recognizing the EOF code. Accordingly, there is no need to detect the end of the block data by counting the decoded character data. This results in a simplified structure of the decoding apparatus, and the decoding operation can be performed at a high speed.

Additionally, in the first to third embodiments, although the input data is output via the buffer, a high-speed operation may be achieved without a delay caused by the buffer.

Figure 11:
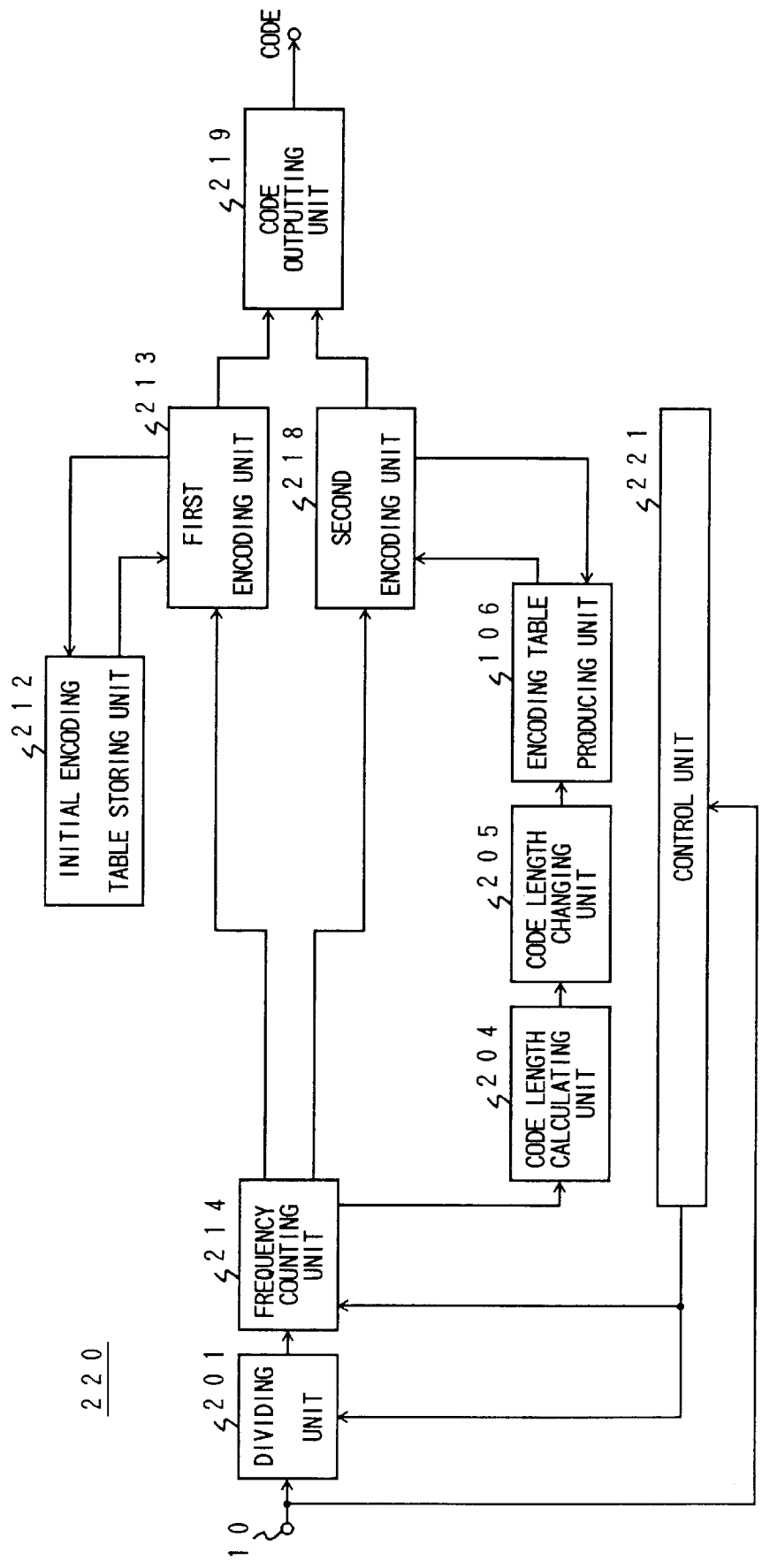
FIG. 11 is a block diagram of an encoding apparatus according to a fourth embodiment of the present invention.

FIG. 11 is a block diagram of a fourth embodiment of the present invention. In FIG. 11, parts that are the same as the parts shown in FIG. 10 are given the same reference numerals, and descriptions thereof will be omitted.

In this embodiment, an encoding apparatus 220 includes the dividing unit 201 and a control unit 221. The input data supplied to the terminal 10 is divided into block data by the dividing unit 201 and the control unit 221, and the block data is supplied to a frequency counting unit 214. When first block data is derived from the input data and supplied to the frequency counting unit 214, the frequency counting unit 214 calculates the frequency of each character included in the first block data, and supplies the frequency information to the code length calculating unit 204. At this time, the frequency counting unit 214 is controlled to output the first block data to a first encoding unit 213 when an output path is selected by the control unit 221 and when the first block data is subjected to the calculation.

The first encoding unit 213 is connected with an initial encoding table storing unit 212 in which an encoding table is previously stored so that the first block data is encoded in accordance with the initial encoding table stored in the initial encoding table storing unit 212. The code encoded by the first encoding unit 213 is supplied to a code outputting unit 219. The code outputting unit 219 byte-packs and outputs the codes output from the first encoding unit 213. At this time, an encoding table is produced by the code length calculating unit 204, the code length changing unit 205 and an encoding table producing unit 206 based on the frequencies calculated on the first block data.

When the second block data is derived from the input data by the dividing unit 201, the control unit 221 controls the frequency counting unit 214 so that the second block data subjected to the calculation of the frequency counting unit 214 is supplied to a second encoding unit 218.

The second encoding unit 218 is connected to the encoding table producing unit 206 so as to perform an encoding operation in accordance with the encoding table produced by the encoding table producing unit 206. When the second block data is supplied to the second encoding unit 218, the encoding table which was produced based on the frequencies of the characters in the first block data is stored in the encoding table producing unit 206.

Accordingly, the second block data is encoded in accordance with the encoding table produced based on the frequency of characters in the first block data, and is supplied to the code outputting unit 219. The code outputting unit 219 byte-packs and outputs the codes supplied from the second encoding unit 218. At this time, an encoding table is produced by the code length calculating unit 204, the code length changing unit 205 and the code length producing unit 206 in accordance with the frequency information from the second block data.

All block data subsequent to the second block data is supplied to the second encoding unit 218, and is encoded in accordance with an encoding table produced based on the frequency information from previous block data.

As mentioned above, in the encoding apparatus 220 according to the present embodiment, the encoding operation can be performed without a time delay of input data provided by a buffer. Thus, there is no need to provide a buffer which results in reduction in a circuit scale, and a high-speed encoding operation is achieved.

Figure 12:
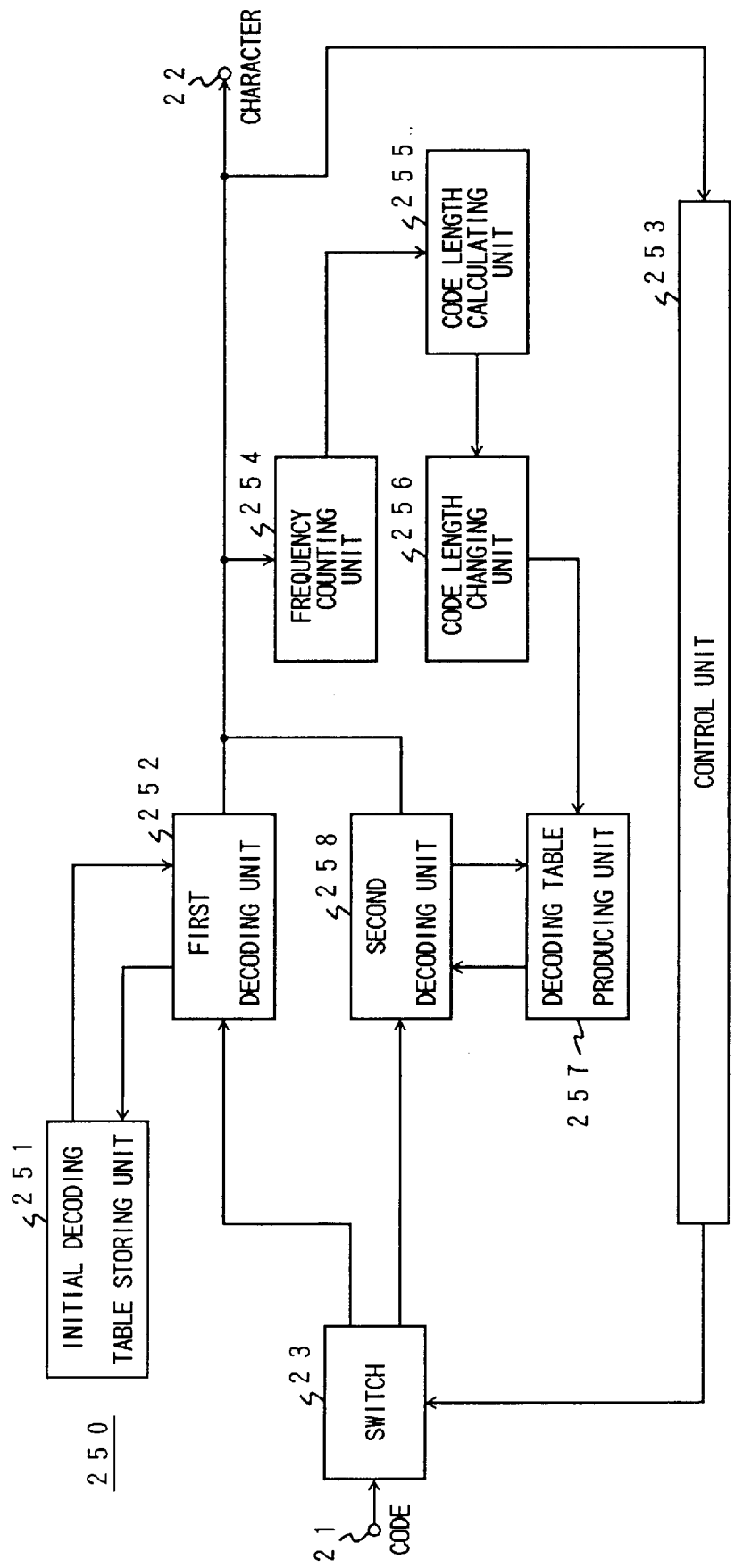
FIG. 12 is a block diagram of a decoding apparatus according to the fourth embodiment of the present invention.

A description will now be given of a decoding apparatus 250 which decodes the codes encoded by the above-mentioned encoding apparatus 220, by referring to FIG. 12.

The codes encoded by the encoding apparatus 220 are supplied to a terminal 21 which is connected to a switch 23. The switch 23 is connected to a control unit 253 so that a direction of the supply of the codes is switched to a first decoding unit 252 or a second decoding unit 258 by a control of the control unit 253.

The control unit 253 is connected to an output terminal 22 from which data is output. The control unit 253 counts the data output from the output terminal 22, that is, the number of characters. The control unit 253 switches the switch 23 when the counted number reaches the number of characters included in each block data derived by the dividing unit 201 of the encoding apparatus 220. The control unit 253 switches the switch 23 to supply the codes to the first decoding unit 252 when the first block data is not yet output, and switches the switch 23 to supply the codes to the second decoding unit 258 after the first block data is output.

When the codes obtained by encoding the first block data are supplied to the input terminal 21, the codes are supplied to the first decoding unit 252. The first decoding unit 252 is connected to an initial decoding table storing unit 251 so that the first decoding unit 252 decodes the supplied codes in accordance with an initial decoding table previously stored in the initial decoding table storing unit 251.

The initial decoding table storing unit 251 stores a decoding table which corresponds to the encoding table stored in the initial encoding table storing unit 212 of the encoding apparatus 220. Thus, the first block data is encoded in accordance with the encoding table stored in the initial encoding table storing unit 212 of the encoding apparatus 220, and is supplied to the first decoding unit 252 in the decoding apparatus 250. Since the encoded first block data is decoded in accordance with the decoding table which corresponds to the encoding table stored in the initial encoding table storing unit 212 of the encoding apparatus 220, the first block data can be restored to the original data.

At this time, the decoded data of the first decoding unit 252 is supplied to a frequency counting unit 254. The frequency counting unit 254 calculates the frequency of appearance of the decoded characters. The result of calculation by the frequency counting unit 254 is supplied to a code length calculating unit 255.

The code length calculating unit 255 calculates the code length which corresponds to the frequency of appearance of each character supplied by the frequency counting unit 254. The code length assigned to each character calculated by the code length calculating unit 255 is supplied to a code length changing unit 256.

The code length changing unit 256 changes the code length assigned to each character to a predetermined code length, and supplies it to a decoding table producing unit 257. The decoding table producing unit 257 produces a decoding table by setting codes corresponding to the code length changed by the code length changing unit 256.

As mentioned above, when the first block data is decoded by the first decoding unit 252, the decoding table is produced in the decoding table producing unit 257 by the frequency counting unit 254, the code length calculating unit 255, the code length changing unit 256 and the decoding table producing unit 257, the decoding table corresponding to the frequencies of the characters in the first block data.

When the decoding of the first block data is ended in the first decoding unit 252, the control unit 253 detects the end of the first block data from the number of decoded characters. After detecting the end of the first block data, the control unit 253 switches the switch 23 so that the codes from the encoding apparatus 220 are supplied to the second decoding unit 258. The second decoding unit 258 is connected to the decoding table producing unit 257 so as to perform a decoding operation in accordance with the decoding table stored in the decoding table producing unit 257.

When the codes obtained by encoding the second block data are supplied to the second decoding unit 258, the decoding table corresponding to the first block data is stored in the decoding table producing unit 257. Accordingly, the codes obtained by encoding the second block data are decoded in accordance with the decoding table corresponding to the frequency of appearance of characters in the first block data. Since the second block data was encoded in the encoding apparatus 220 in accordance with the encoding table corresponding to the frequency of appearance of the characters in the first block data, the original data can be restored by the second decoding unit 258.

After the codes obtained by encoding the second block data are decoded by the second decoding unit 258, the decoding table corresponding to the frequency of appearance of the characters in the second block data is produced by the frequency counting unit 254, the code length calculating unit 255, the code length changing unit 256 and the decoding table producing unit 257. After the codes obtained by encoding the first block data is decoded, the control unit 253 maintains the switch 23 so that the codes supplied to the terminal 21 are supplied to the second decoding unit 258.

Accordingly, in the second decoding unit 258, the decoding is performed in accordance with the decoding table which is produced in response to the frequency of appearance of the characters in the data obtained by decoding the codes obtained by encoding the previous block data. That is, the original data can be restored since the encoding operation in the encoding apparatus 220 is performed with respect to the block data subsequent to the second block data in accordance with the encoding table which is produced in response to the frequency of appearance of the characters in the previous block data, and the decoding operation in the decoding apparatus 250 is performed with respect to the codes obtained by encoding the block data subsequent to the second block data in accordance with the decoding table which is produced in response to the frequency of appearance of the characters in the data obtained by decoding the codes obtained by encoding the previous block data.

As mentioned above, according to the present embodiment, since the input data can be encoded and decoded without a buffer, the data encoding and decoding can be performed at a high speed. Additionally, since the encoding table is produced for each block data, a higher compression ratio can be expected, and there is no need to send information with respect to the encoding table used for the block data subsequent to the second block data. Thus, the amount of information necessary for encoding can be reduced, and a high compression ratio can be expected.

It should be noted that, although the first block data is encoded and decoded in accordance with the initial encoding table and the initial decoding table, it is possible that the encoding and decoding can be performed without using a previously prepared encoding and decoding table such as the initial encoding and decoding table. In such a case, encoding efficiency may be reduced for the first block data, but there is no need to send information other than the codes.

Figure 13:
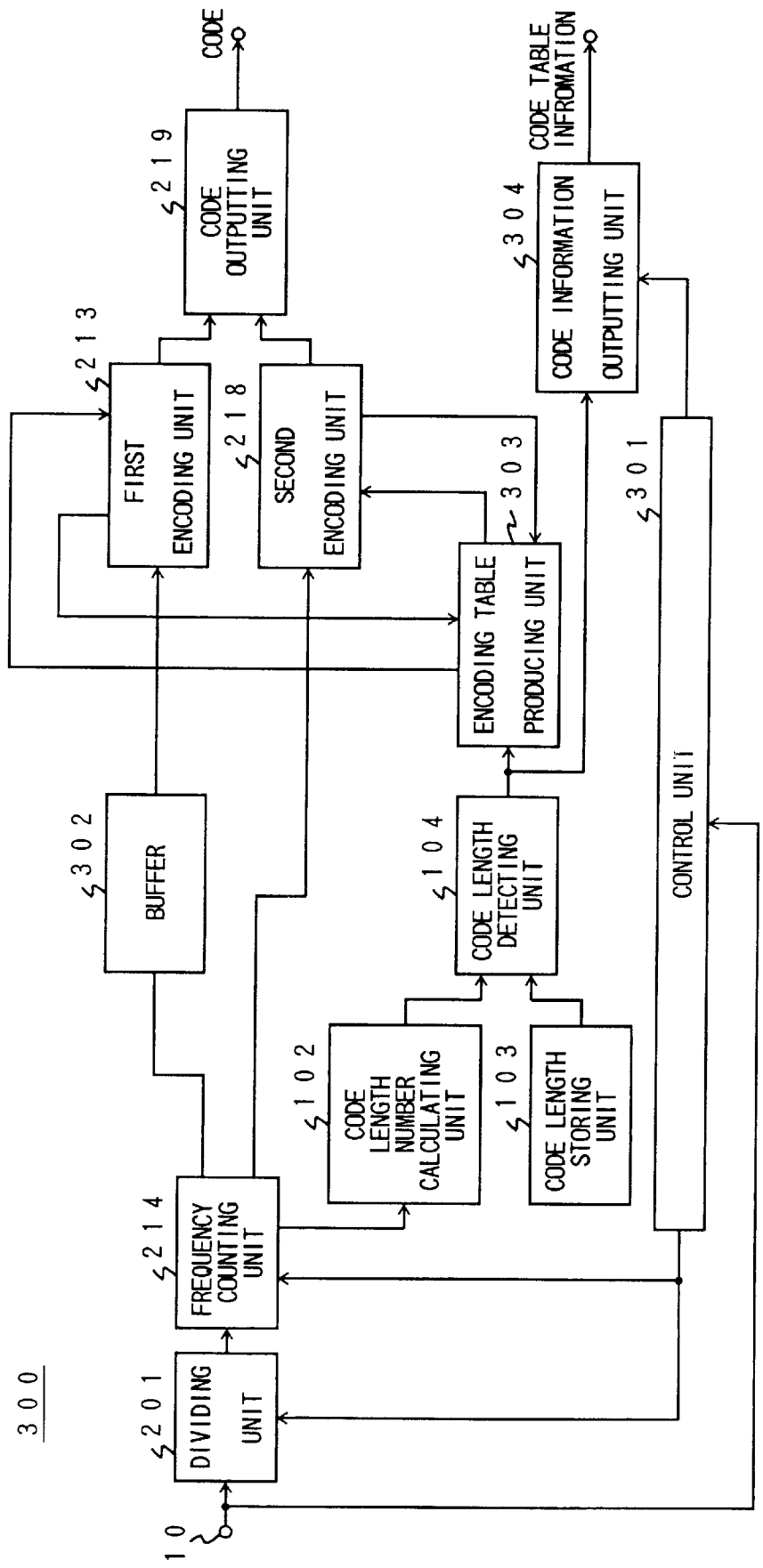
FIG. 13 is a block diagram of a fifth embodiment of the present invention.

FIG. 13 is a block diagram of a fifth embodiment of the present invention. In FIG. 13, parts that are the same as the parts shown in FIGS. 11 and 12 are given the same reference numerals, and descriptions thereof will be omitted.

This embodiment relates to an encoding apparatus 300. In the encoding apparatus 300, the input data supplied to the input terminal 10 is divided into block data by the dividing unit 201 and a control unit 301, and the block data is supplied to the frequency counting unit 214. The frequency counting unit 214 calculates the frequency of appearance of the characters in each block data. The frequency counting unit 214 is controlled by the control unit 301 so that the block data, which was subjected to calculation of frequency, is selectively supplied to either a buffer 302 or the second encoding unit 218.

The control unit 301 monitors the input data to count the number of characters in the input data in order to control the dividing unit 201 to divide the input data for each predetermined number of characters by calculating the number of characters. Additionally, when the first block data of the input data is supplied, the control unit 301 controls the frequency control unit 214 to supply the first block data to the buffer 302 when the first block data of the input data is supplied.

The frequency counting unit 214 counts the frequency of appearance of characters in the first block data when the first block data is supplied thereto, and supplies the frequency information to the code length number calculating unit 102. The code length number calculating unit 102, the code length storing unit 103, the code length detecting unit 104 and an encoding table producing unit 303 together produce an encoding table which corresponds to the frequency of appearance of the characters in the first block data.

When the encoding table corresponding to the frequency of appearance of the characters in the first block data is produced in the encoding table producing unit 303, the first block data is supplied to the first encoding unit 213 from the buffer 302. The first encoding unit 213 encodes the first block data in accordance with the encoding table produced in the encoding table producing unit 303, the encoding table corresponding to the frequency of appearance of the characters in the first block data. The encoded data is supplied to the code outputting unit 219.

The code information produced by the code length detecting unit 104 is supplied to a code information outputting unit 304, and then is sent to the decoding apparatus side together with the encoded data. Thereafter, the control unit 301 controls the frequency counting unit 214 so that the second block data and block data subsequent to the second block data are supplied to the second encoding unit 218 after the block data is subjected to the calculation of frequency. When the second block data is supplied, the second encoding unit 218 encodes the second block data in accordance with the encoding table stored in the encoding table producing unit 303, the encoding table corresponding to the frequency of appearance of the characters in the first block data.

The second block data which was encoded by the second encoding unit 218 is supplied to the code outputting unit 219, and is output. At this time, the code information is output from the code information outputting unit 304 to the decoding apparatus side.

Additionally, an encoding table corresponding to the frequency of appearance of the characters in the second block data is produced in the encoding table producing apparatus 303 by cooperation of the frequency counting unit 214, the code length number calculating unit 102, the code length storing unit 103, the code length detecting unit 104 and the code table producing unit 303.

As mentioned above, only the first block data is encoded in accordance with the encoding table corresponding to the frequency of appearance of the characters in the first block data, and the second block data and block data subsequent to the second block data are encoded by the encoding table corresponding to the frequency of appearance of characters in the previous block data. Additionally, only the first block data is stored in the buffer 302 so that the fist block data is encoded after the encoding table is produced. Thus, the size of the buffer and the circuit scale can be reduced by reducing the size of the first block data.

Figure 14:
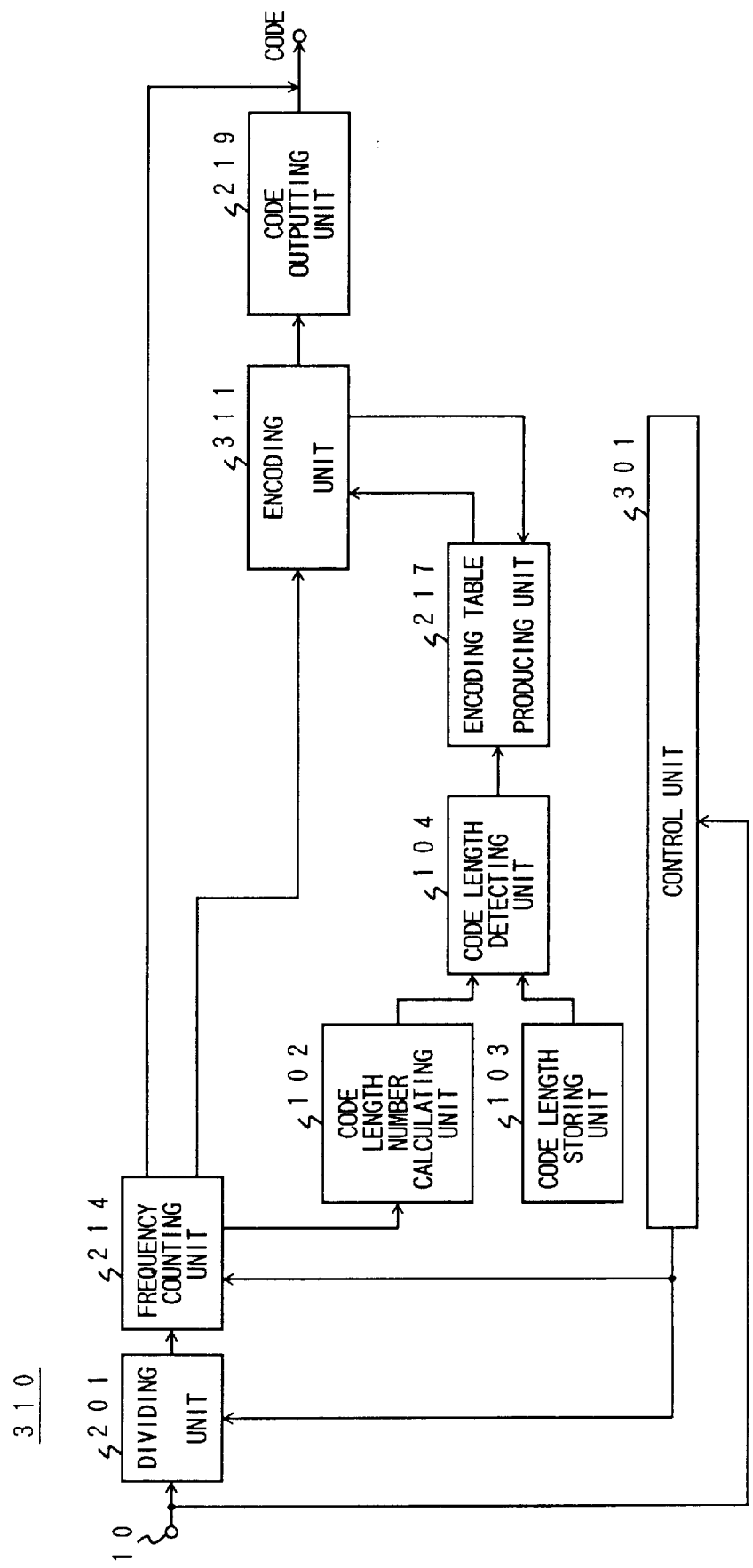
FIG. 14 is a block diagram of a sixth embodiment of the present invention.

FIG. 14 is a block diagram of a sixth embodiment of the present invention. In FIG. 14, parts that are the same as the parts shown in FIG. 13 are given the same reference numerals, and descriptions thereof will be omitted.

In an encoding apparatus 310 according to the present embodiment, when the first block data is supplied to the terminal 10, the control unit 301 detects the supply. Then, the first block data subjected to calculation of the frequency of appearance of the characters is supplied to the encoding apparatus side. When the first block data is supplied to the decoding apparatus, an encoding table is produced by cooperation of the frequency counting unit 214, the code length number calculating unit 102, the code length storing unit 103, the code length detecting unit 104 and an encoding table producing unit 217.

When the second block data is supplied to the terminal 10, the control unit 301 controls the frequency counting unit 214 to supply the second block data to an encoding unit 311. The second block data is encoded by the encoding unit 311 in accordance with the encoding table stored in the encoding table producing unit 217, the encoding table corresponding to the frequency of appearance of the characters in the first block data. At this time, an encoding table corresponding to the frequency of appearance of the characters in the second block data is produced by cooperation of the frequency counting unit 214, the code length number calculating unit 102, the code length storing unit 103, the code length detecting unit 104 and the code table producing unit 217.

It should be noted that block data subsequent to the second block data is encoded in accordance with the encoding table produced based on the frequency of appearance of characters in the previous block data.

According to the present embodiment, since the first block data is directly output without being subjected to encoding, there is no need to provide a delay by a buffer. Thus, an output of the data can be performed at a high speed.

Additionally, since the first block data is directly output, a so-called negative compression in which the amount of data after encoding becomes larger than the amount of the original data cannot occur.

Figure 15:
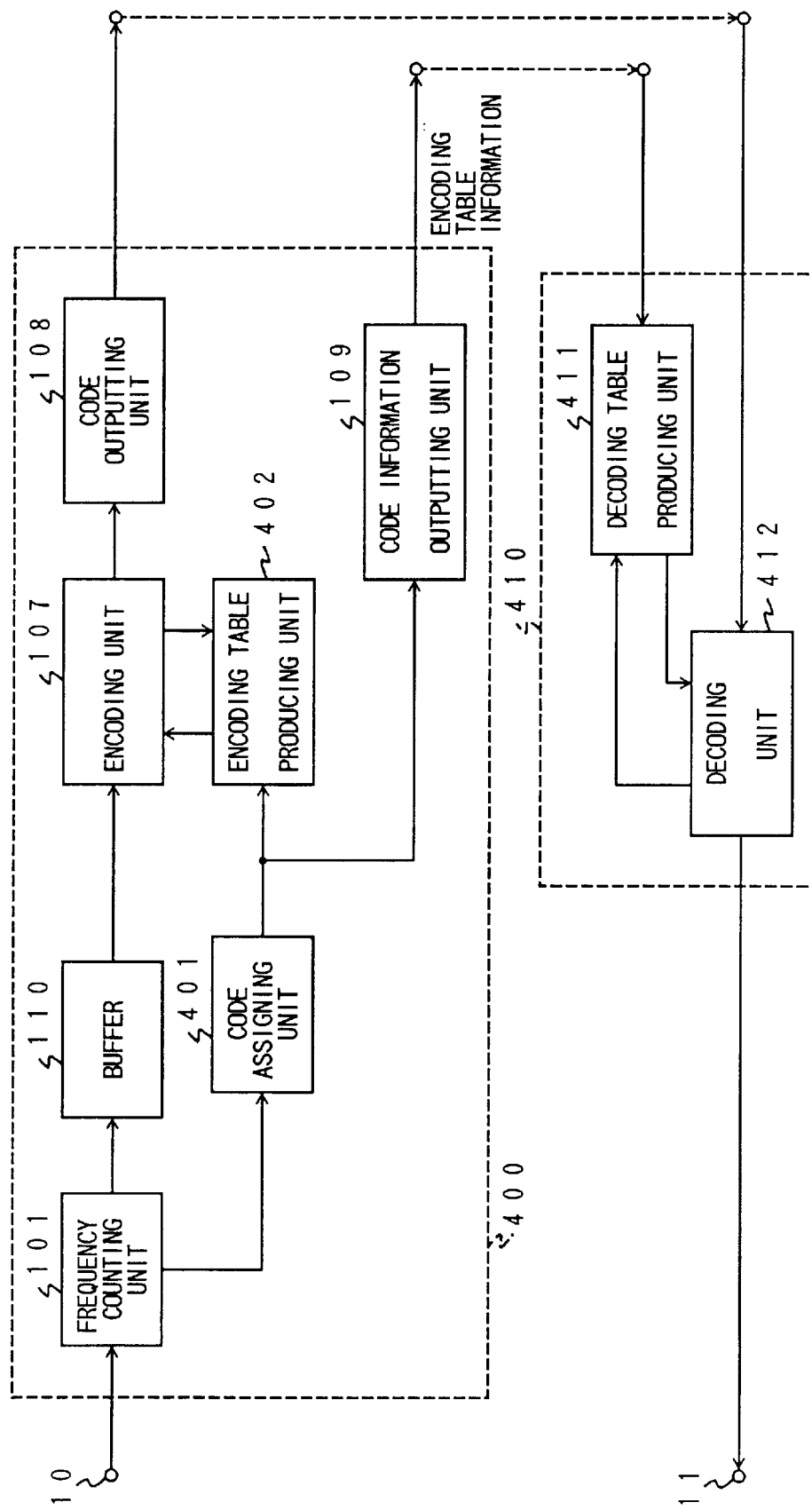
FIG. 15 is a block diagram of a seventh embodiment of the present invention.

FIG. 15 is a block diagram of a seventh embodiment of the present invention. In FIG. 15, parts that are the same as the parts shown in FIG. 10 are given the same reference numerals, and descriptions thereof will be omitted.

In the present embodiment, an encoding operation is performed in accordance with an encoding table produced by setting a plurality of character data to a code having a fixed length.

In an encoding apparatus 400 of the present embodiment, the information with respect to the frequency of appearance of the characters calculated by the frequency counting unit 101 is supplied to a code assigning unit 401. The code assigning unit 401 sets the codes corresponding to a plurality of character data to a predetermined code length in accordance with the frequency of appearance of the character data in the input data which is counted by the frequency counting unit 101.

FIG. 16 is an illustration for explaining an operation of the code assigning unit according to the seventh embodiment of the present invention. FIG. 16-(A) indicates an example of assignment of a code to a single symbol, and FIG. 16-(B) indicates an operation for producing a predetermined length from a combination of a plurality of symbols.

As shown in FIG. 16-(A), it is assumed that, in response to the frequency of appearance of a symbol, a code "00" is set to the symbol "a"; a code "100" is set to the symbol "b"; a code "1110" is set to the symbol "c"; a code "11110" is set to the code "d"; and a code "01" is set to the symbol "e".

Additionally, it is assumed that a fixed code length is set to 8 bits by the code assigning unit 401. The combination of codes which results in 8 bits is produced by combining appropriate codes. For example, in the case of the symbols shown in FIG. 16-(A), since the symbols comprise 2, 3, 4 or 5 bits, there are combinations such as (2+2+2+2) bits, (2+2+4) bits, (2+3+3) bits, (4+4) bits and (3+5) bits as shown in FIG. 16-(B).

With respect to the combination of codes having a code length of (2+2+2+2) bits, 16 combinations of symbols can be produced such as "aaaa", "aeee", "eeee", etc. Additionally, with respect to the combination of codes having a code length of (2+2+4) bits, 12 combinations of symbols can be produced such as "aac", "aca", "ece", "cee", etc. Further, with respect to the combination of codes having a code length of (2+3+3) bits, 6 combinations of symbols can be produced such as "abb", "bab", "beb", "bbe", etc. Additionally, with respect to the combination of codes having a code length of (4+4) bits, 1 combination of symbols can be produced such as "cc". Further, with respect to the combination of codes having a code length of (3+5) bits, 2 combinations of symbols can be produced such as "bd" and "db".

The codes having the 8-bit fixed code length including the combinations of a plurality of symbols as mentioned above are stored as an encoding table in an encoding table producing unit 402.

The encoding unit 107 encodes the character data in accordance with the encoding table produced in the encoding table producing unit 402. At this time, since codes produced by a combination of a plurality of symbols (character data) are stored in the encoding table producing unit 402, the plurality of symbols can be simultaneously encoded. Accordingly, the encoding operation can be performed efficiently. Additionally, since the codes are set to 8-bit code length, the codes can be directly output from the code outputting unit 108. Thus, a high-speed output can be achieved.

The present invention is not limited to the specifically disclosed embodiments, and variations and modifications may be made without departing from the scope of the present invention.

What is claimed is:

1. A data encoding method for encoding input data which includes a plurality of elementary data by assigning a code to each elementary data, said code having a code length corresponding to a frequency of appearance of the corresponding elementary data, the assigned code to be output being packed into a data unit having a fixed data length, said data encoding method comprising the steps of:

a) fixing the code length of the code assigned to each elementary data to a predetermined length so that said fixed data length of said data unit is a multiple of the predetermined length;

b) encoding each elementary data into the code having the predetermined length; and c) packing the encoded code into said data unit so that the encoded code is output when a total length of the packed codes becomes said fixed data length of said data unit.

2. The data encoding method as claimed in claim 1, wherein a packing of the encoded code is performed on a code unit basis so that the encoded code is prevented from being divided and packed into a plurality of said data units.

3. The data encoding method as claimed in claim 1, wherein the predetermined length of the code assigned to each elementary data in step a) includes a plurality of lengths so that said fixed data length of said data unit is formable by a combination of said plurality of lengths.

4. The data encoding method as claimed in claim 3, further comprising the step of:

d) counting the frequency of appearance of each elementary data contained in the input data, wherein one of said lengths is assigned, in step a), to each elementary data in accordance with the frequency of appearance of the elementary data.

5. A data encoding apparatus for encoding input data which includes a plurality of elementary data having a fixed length by assigning a code to each elementary data, said code having a code length corresponding to a frequency of appearance of the corresponding elementary data, the assigned code to be output being packed into a data unit having a fixed data length, said data encoding apparatus comprising:

a frequency counting unit for counting the frequency of appearance of each elementary data in said input data;

an encoding table producing unit for producing an encoding table produced based on a plurality of predetermined code lengths in accordance with the frequency counted by said frequency counting unit;

an encoding unit for encoding the input data into a set of the codes in accordance with said encoding table produced by said encoding table producing unit;

a code outputting unit for packing the codes obtained by said encoding unit, and outputting the packed codes by said data unit having said fixed data length; and a code information outputting unit for outputting information with respect to said encoding table.

6. A data encoding apparatus for encoding input data which includes a plurality of elementary data having a fixed length by assigning a code to each elementary data, the code having a code length corresponding to a frequency of appearance of the corresponding elementary data, the assigned code to be output being packed into a data unit having a fixed data length, said data encoding apparatus comprising:

an encoding table storing unit for storing an encoding table in which one of a plurality of codes having different code lengths is assigned to each elementary data;

an encoding unit for encoding said elementary data in accordance with said encoding table; and a code outputting unit for outputting the codes obtained by said encoding unit by packing the codes into said data unit having said fixed data length.

7. A data encoding apparatus for encoding input data which includes a plurality of elementary data having a fixed length by assigning a code to each elementary data, the code having a code length corresponding to a frequency of appearance of the corresponding elementary data, the assigned code to be output being packed into a data unit having a fixed data length, the input data being divided into block data having a predetermined amount of data, said data encoding apparatus comprising:

a frequency counting unit for counting a frequency of each elementary data in each block data;

an encoding table producing unit for producing an encoding table which represents a relationship between the elementary data and predetermined code lengths corresponding to the frequency obtained by said frequency counting unit;

an encoding unit for encoding the block data in accordance with said encoding table produced by said encoding table producing unit; and a code outputting unit for outputting the codes obtained by said encoding unit by packing the codes into said data unit having said fixed data length.

8. A data encoding apparatus for encoding input data which includes a plurality of elementary data having a fixed length by assigning a code to said data, said code having a code length corresponding to a frequency of appearance of the corresponding elementary data, the assigned data to be output being packed into a data unit having a fixed data length so, the input data being divided into block data having a predetermined amount of data, said data encoding apparatus comprising:

a frequency counting unit for counting a frequency of each elementary data in each block data;

an encoding table storing unit for storing an initial encoding table in which one of a plurality of codes having different code lengths is assigned to each elementary data;

a first encoding unit for encoding the block data in accordance with said previously produced encoding table, first block data which is first divided from the input data is encoded by said first encoding unit;

an encoding table producing unit for producing an encoding table which represents a relationship between the elementary data and the codes having predetermined code lengths corresponding to the frequency obtained by said frequency counting unit;

a second encoding unit for encoding second block data subsequent to said first block data and the block data subsequent to the second block data in accordance with said encoding table produced by said encoding table producing unit, an encoding operation of said second encoding unit being performed based on said encoding table which is produced in accordance with the frequency of appearance of the elementary data included in the block data previous to the block data presently encoded;

a code outputting unit for outputting the codes obtained by one of said first and second encoding units by packing the codes into said data unit having said fixed data length; and a control unit for controlling an encoding operation of said data encoding apparatus.

9. A data encoding apparatus for encoding input data which includes a plurality of elementary data having a fixed length by assigning a code to each elementary data, the code having a code length corresponding to a frequency of appearance of the corresponding elementary data, the assigned code to be output being packed into a data unit having a fixed data length, the input data being divided into block data having a predetermined amount of data, said data encoding apparatus comprising:

a frequency counting unit for counting a frequency of appearance of each elementary data in the block data;

a data buffer for storing first block data which is divided first from the input data;

an encoding table producing unit for producing an encoding table which represents a relationship between the elementary data and the codes having predetermined code lengths corresponding to the frequency obtained by said frequency counting unit;

a first encoding unit for encoding said first block data in accordance with said encoding table produced by said encoding table producing unit, an encoding operation of said first encoding unit being performed based on said encoding table which is produced in accordance with the frequency of appearance of the elementary data included in said first block data;

a second encoding unit for encoding second block data and the block data subsequent to said second block data in accordance with said encoding table produced by said encoding table producing unit, an encoding operation of said second encoding unit being performed based on said encoding table which is produced in accordance with the frequency of appearance of the elementary data included in the block data previous to the block data presently encoded;

a code outputting unit for outputting the codes obtained by one of said first and second encoding units by packing the codes into said data unit having said fixed data length; and a control unit for controlling an encoding operation of said data encoding apparatus so that said first block data is supplied to said first encoding unit via said data buffer, and said second and subsequent block data is supplied to said second encoding unit.

10. A data encoding apparatus for encoding input data which includes a plurality of data having a fixed length by assigning a code to each elementary data, said code having a code length corresponding to a frequency of appearance of the corresponding elementary data, the assigned code to be output being packed into a data unit having a fixed data length, the input data being divided into block data having a predetermined amount of data, said data encoding apparatus comprising:

a frequency counting unit for counting a frequency of each elementary data included in the block data;

an encoding table producing unit for producing an encoding table which represents a relationship between the elementary data and the codes having predetermined code lengths corresponding to the frequency obtained by said frequency counting unit;

an encoding unit for encoding the block data in accordance with said encoding table produced by said encoding table producing unit, an encoding operation of said encoding unit being performed based on said encoding table which is produced in accordance with the frequency of appearance of the elementary data included in the block data previous to the block data presently encoded;

a code outputting unit for outputting the code obtained by said encoding unit by packing the codes into said unit having said fixed data length; and a control unit for controlling an encoding operation of said data encoding apparatus so that first block data which is first divided from said input data is directly output, and second and subsequent block data is supplied to said encoding unit.

11. The data encoding apparatus as claimed in claim 7, wherein said frequency counting unit counts the frequency of appearance of the elementary data within a predetermined part of the block data.

12. The data encoding apparatus as claimed in claim 8, wherein said frequency counting unit counts the frequency of appearance of the elementary data within a predetermined part of the block data.

13. The data encoding apparatus as claimed in claim 9, wherein said frequency counting unit counts the frequency of appearance of the elementary data within a predetermined part of the block data.

14. The data encoding apparatus as claimed in claim 10, wherein said frequency counting unit counts the frequency of appearance of the elementary data within a predetermined part of the block data.

15. The data encoding apparatus as claimed in claim 8, wherein said first and second encoding units provide a predetermined code at an end of a series of the codes corresponding to each block data.

16. The data encoding apparatus as claimed in claim 9, wherein said first and second encoding units provide a predetermined code at an end of a series of the codes corresponding to each block data.

17. A data decoding apparatus for decoding a code to original data, said code obtained by encoding said original data by assigning said code corresponding to a frequency of appearance of data having a fixed data length, said data decoding apparatus comprising:

a decoding table storing unit for storing a first decoding table which corresponds to an encoding table used for encoding said original data;

a first decoding unit for decoding a first sets of the codes in accordance with said first decoding table;

a frequency counting unit for counting a frequency of appearance of the original data decoded from said code;

a decoding table producing unit for producing a second decoding table representing a relationship between the original data and the code having a predetermined code length in accordance with the frequency obtained by said frequency counting unit;

a second decoding unit for decoding a second set and subsequent sets of the codes in accordance with said second decoding table corresponding to a set of the codes previous to a set of codes presently decoded; and a control unit for controlling supply of the codes so that said first set of the codes is supplied to said first decoding unit and said second set of the codes and said set of the codes subsequent to said second set of the codes are supplied to said second decoding unit.

18. A data encoding method for encoding input data which includes a plurality of elementary data having a fixed length by assigning a code to each elementary data, the code having a code length corresponding to a frequency of appearance of the corresponding elementary data, the assigned code to be output being packed into a data unit having a fixed data length, said data encoding method comprising the steps of:

a) counting a frequency of appearance of the elementary data in the input data;

b) assigning the code to each elementary data in accordance with the frequency counted in step a);

c) combining a plurality of elementary data so that a total length of the codes corresponding to the combined elementary data becomes said data unit having said fixed data length;

d) encoding the combined elementary data to a code, and outputting the code by said data unit having said fixed data length; and e) outputting code information used for decoding the code encoded in step d).

19. A data decoding method for decoding a code to original data, said code obtained by encoding said original data by assigning said code corresponding to a frequency of appearance of data having a fixed data length, said data decoding method comprising the steps of:

a) producing a decoding table in accordance with code information with respect to an encoding operation for producing said code;

b) decoding said code in accordance with said decoding table produced in step a) by each predetermined code length; and c) outputting a decoded value obtained in step b).

20. A data encoding apparatus for encoding input data including a plurality of elementary data having a fixed length by assigning a code to each elementary data, the code having a code length corresponding to a frequency of appearance of the corresponding elementary data, the assigned code to be packed being output by a data unit having a fixed data length, said data encoding apparatus comprising:

a frequency counting unit for counting a frequency of each data in the input data;

an encoding table producing unit for producing an encoding table which represents a relationship between the elementary data and the codes having predetermined code lengths corresponding to the frequency obtained by said frequency counting unit, said predetermined code length including a plurality of code lengths corresponding to each elementary data;

an encoding unit for encoding the input data in accordance with said encoding table produced by said encoding table producing unit;

a code outputting unit for outputting the codes encoded by said encoding unit by packing the code into said data unit having said fixed data length; and a code information outputting unit for outputting information with respect to said encoding table.

* * * * *